United States Patent
Chen et al.

(10) Patent No.: US 11,972,971 B2
(45) Date of Patent: Apr. 30, 2024

(54) WAFER LIFT PIN SYSTEM

(71) Applicant: Taiwan Semiconductor Manufacturing Company, Ltd., Hsinchu (TW)

(72) Inventors: Yu-Chen Chen, Hemei Township (TW); Yi-Fam Shiu, Toufen (TW); Cheng-Lung Wu, Zhunan Township (TW); Yang-Ann Chu, Hsinchu (TW); Jiun-Rong Pai, Jhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 487 days.

(21) Appl. No.: 17/249,566

(22) Filed: Mar. 5, 2021

(65) Prior Publication Data
US 2022/0285202 A1 Sep. 8, 2022

(51) Int. Cl.
*H01L 21/687* (2006.01)
*H01L 21/67* (2006.01)

(52) U.S. Cl.
CPC .. *H01L 21/68742* (2013.01); *H01L 21/67253* (2013.01); *H01L 21/68785* (2013.01)

(58) Field of Classification Search
CPC ................................................ H01L 21/68742
See application file for complete search history.

(56) References Cited

U.S. PATENT DOCUMENTS

| | | | |
|---|---|---|---|
| 2017/0217066 A1* | 8/2017 | Galati | B29C 45/281 |
| 2019/0242015 A1* | 8/2019 | Ohashi | C23C 16/00 |
| 2021/0011468 A1* | 1/2021 | Terasawa | G05B 19/4184 |
| 2021/0265194 A1* | 8/2021 | Wirth | H01J 37/32743 |

* cited by examiner

*Primary Examiner* — Mahdi H Nejad
(74) *Attorney, Agent, or Firm* — Harrity & Harrity, LLP

(57) ABSTRACT

A wafer lift pin system is capable of dynamically modulating or adjusting the flow of gas into and out of lift pins of the wafer lift pin system to achieve and maintain a consistent pressure in supply lines that supply the gas to the lift pins. This enables the wafer lift pin system to precisely control the speed, acceleration, and deceleration of the lift pins to achieve consistent and repeatable lift pin rise times and fall times. A controller and various sensors and valves may control the gas pressures in the wafer lift pin system based on various factors, such as historic rise times, historic fall times, and/or the condition of the lift pins. This enables smoother and more controlled automatic operation of the lift pins, which reduces and/or minimizes wafer shifting and wafer instability, which may reduce processing defects and maintain or improve processing yields.

20 Claims, 15 Drawing Sheets

WAFER LIFT PIN SYSTEM

BACKGROUND

A semiconductor wafer may be processed in various semiconductor processing tools in a semiconductor fabrication facility to produce various integrated circuits and/or semiconductor devices. A semiconductor wafer may be placed in a processing chamber of a semiconductor processing tool, such as an etch tool or a deposition tool, to perform one or more semiconductor processing operations thereon.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
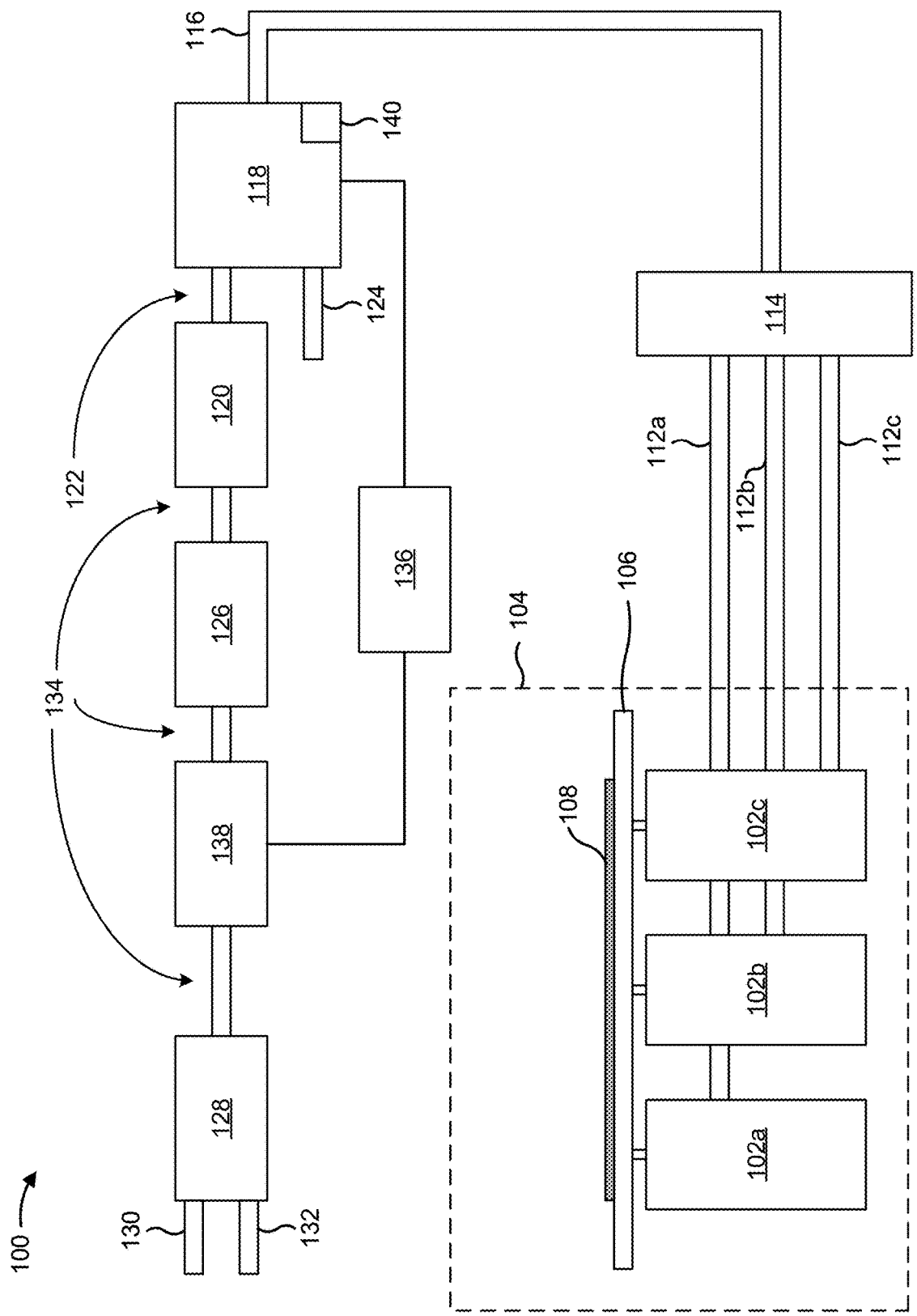
FIGS. 1A and 1B are diagrams of an example wafer lift pin system described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

To transfer a semiconductor wafer in a processing chamber of a semiconductor processing tool, a wafer transport tool (e.g., a robotic arm) may place the semiconductor wafer on a plurality of lift pins that protrude through the surface of a base (e.g., a platform, a chuck, a wafer stage) in the processing chamber. The lift pins then retract through the surface of the base to transfer the semiconductor wafer on to the base for processing.

Various types of control systems may be used to control the operation of the lift pins. One type of control system includes a pneumatic control system, in which gas pressure is used to extend and retract (or raise and lower) the lift pins. In some cases, variation in gas pressure may affect the rise times and fall times of the lift pins because gas may be provided to and purged from the cylinders of the lift pins at a fixed rate. This can result in wafer stability issues, which can cause the semiconductor wafer to shift during extension and/or retraction of the lift pins. Wafer shifting can lead to wafer misalignment, which can cause processing defects, reduced yield, and increased repairs.

Some implementations described herein provide a wafer lift pin system that is capable of dynamically modulating or adjusting the flow of gas into and out of the lift pins of the wafer lift pin system to achieve and maintain a consistent pressure in supply lines that supply the gas to the lift pins. This enables the wafer lift pin system to precisely control the speed, acceleration, and deceleration of the lift pins to achieve consistent and repeatable lift pin rise times and fall times. The wafer lift pin system may include a controller and various sensors and valves that are capable of configuring and controlling the gas pressures in the wafer lift pin system based on various factors, such as historic rise times, historic fall times, and/or the condition of the lift pins. In this way, the wafer lift pin system enables smoother and more controlled automatic operation of the lift pins, which reduces and/or minimizes wafer shifting and wafer instability resulting from extension and retraction of the lift pins, which may reduce processing defects and maintain or improve processing yields.

Figure 1B:
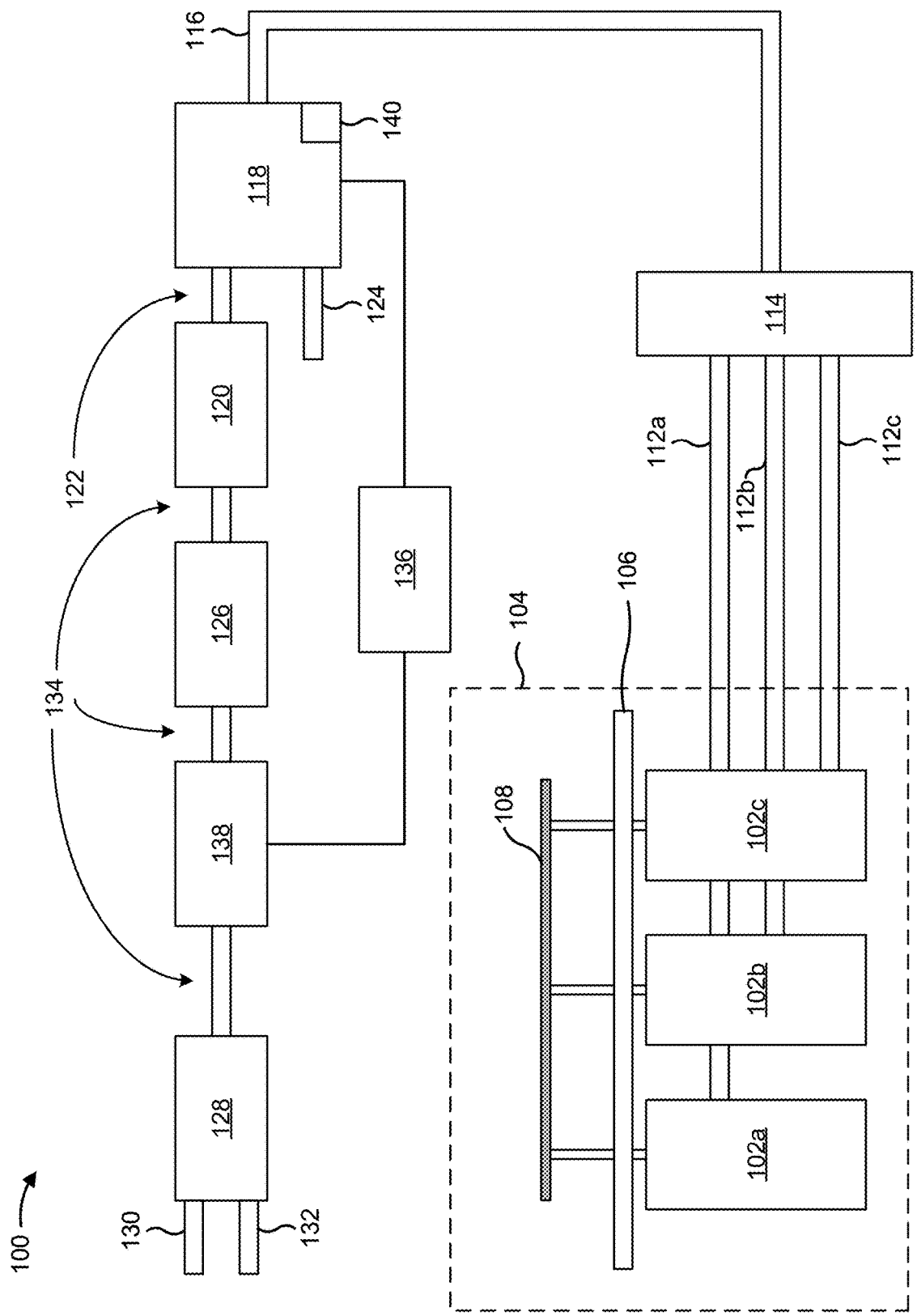

FIGS. 1A and 1B are diagrams of an example wafer lift pin system 100 described herein. The wafer lift pin system 100 may be associated with a semiconductor processing tool, such as an etch tool, a deposition tool (e.g., a physical vapor deposition (PVD) tool, a chemical vapor deposition (CVD) tool), and/or another type of semiconductor processing tool that is used in the processing of semiconductor wafers and/or the manufacture of semiconductor devices. The wafer lift pin system 100 may be configured to raise and lower a semiconductor wafer to permit a wafer transport tool (e.g., a robot arm) to place the semiconductor wafer in a semiconductor processing tool and to retrieve the semiconductor from the semiconductor processing tool.

As shown in FIGS. 1A and 1B, the wafer lift pin system 100 may include one or more lift pins 102a-102c. The one or more lift pins 102a-102c may be included in a processing chamber 104 of a semiconductor processing tool and may be located or positioned under or below a wafer stage 106 in the processing chamber 104. The wafer stage 106 may include a chuck (e.g., an electrostatic chuck (e-chuck) or a vacuum chuck), a platform, or another type of structure configured to support and/or secure a semiconductor wafer 108 thereon.

In some implementations, the wafer lift pin system 100 includes a single lift pin 102. In these examples, the single lift pin 102 may be configured to support the semiconductor wafer 108 at or near a center of the semiconductor wafer 108. In some implementations, the wafer lift pin system 100 includes a plurality of lift pins 102, such as three (3) lift pins as illustrated in the example in FIGS. 1A and 1B. In these examples, the plurality of lift pins 102 may be configured to support the semiconductor wafer 108 in a plurality of locations on the semiconductor wafer 108. In particular, the plurality of lift pins 102 may be configured to support the semiconductor wafer 108 in a combination of locations that permits the semiconductor wafer 108 to be raised and lowered in a stable and secure manner.

Each of the one or more lift pins 102a-102c may include a pin. The pin may be configured to extend or raise at least partially above the top surface of the wafer stage 106 to raise the semiconductor wafer 108 up off of the wafer stage 106. The pins of the one or more lift pins 102a-102c may be configured to raise the semiconductor wafer 108 a sufficient distance above the wafer stage 106 to provide sufficient clearance for a wafer transport tool to secure the semiconductor wafer 108 from underneath the semiconductor wafer 108.

FIG. 1A illustrates an example in which the lift pins 102a-102c (and the wafer lift pin system 100) are in a retracted configuration (or a lowered configuration) in which the pins of the one or more lift pins 102a-102c are retracted under or below the top surface of the wafer stage 106 such that the semiconductor wafer 108 is resting on the wafer stage 106. FIG. 1B illustrates an example in which the lift pins 102a-102c (and the wafer lift pin system 100) are in an extended configuration (or a raised configuration) in which the pins of the one or more lift pins 102a-102c are extended at least partially above the top surface of the wafer stage 106 such that the semiconductor wafer 108 is displaced a distance off of (e.g., above) the wafer stage 106.

Each of the one or more lift pins 102a-102c may include a pneumatic cylinder. The pin of a lift pin may be seated or included in a pneumatic cylinder. The pneumatic cylinder may be capable of being pressurized to permit a pressure in the cylinder to raise (or extend) the pin, and may be capable of being depressurized to lower (or retract) the pin. The pin may raise or extend out of the cylinder based on the pressure in the cylinder satisfying a pressure threshold, and may lower or retract into the cylinder based on the pressure in the cylinder not satisfying the pressure threshold.

In some implementations, each of the one or more lift pins 102a-102c includes a spring included in the cylinder. The spring may press upward on the pin, and may permit a lower pressure threshold to be used to raise or extend the pin and/or may increase the smoothness of operation of the pin.

Gas supply lines 112a-112c may be configured to respectively provide a gas (e.g., air, an inert gas such as nitrogen ($N_2$)) to the cylinders of corresponding ones of the one or more lift pins 102a-102c to enable pressurization of the one or more lift pins 102a-102c (which raises or extends the one or more lift pins 102a-102c). As an example, the gas supply line 112a may be configured to provide a gas to the cylinder of the lift pin 102a, the gas supply line 112b may be configured to provide a gas to the cylinder of the lift pin 102b, the gas supply line 112c may be configured to provide a gas to the cylinder of the lift pin 102c, and so on. Moreover, the gas supply lines 112a-112c may be configured to respectively evacuate or purge a gas from the cylinders of corresponding ones of the one or more lift pins 102a-102c to enable depressurization of the one or more lift pins 102a-102c (which lowers or retracts the one or more lift pins 102a-102c). As an example, the gas supply line 112a may be configured to evacuate or purge a gas from the cylinder of the lift pin 102a, the gas supply line 112b may be configured to evacuate or purge a gas from the cylinder of the lift pin 102b, the gas supply line 112c may be configured to evacuate or purge a gas from the cylinder of the lift pin 102c, and so on.

The gas supply lines 112a-112c may be connected and/or coupled to a manifold 114. The manifold 114 may be connected and/or coupled to a gas supply line 116. The manifold 114 may be configured to split a supply flow of gas flowing through the gas supply line 116 into respective supply flows of the gas through the gas supply lines 112a-112c for corresponding ones of the one or more lift pins 102a-102c. For example, the manifold 114 may split the supply flow of gas flowing through the gas supply line 116 into a first supply flow of the gas through the gas supply line 112a for the lift pin 102a, a second supply flow of the gas through the gas supply line 112b for the lift pin 102b, a third supply flow of the gas through the gas supply line 112c for the lift pin 102c, and so on. Splitting a centralized supply flow of gas flowing through the gas supply line 116 into respective supply flows of the gas through the gas supply lines 112a-112c enables coordinated and even movement of the lift pins 102a-102c (e.g., relative to using independent supply flows of gas). Moreover, the manifold 114 may be configured to collect purged gas from each of the gas supply lines 112a-112c and to provide the collected purge gas to the gas supply line 116.

A proportional valve 118 included in the wafer lift pin system 100 may provide the supply flow of the gas to the manifold 114 through the gas supply line 116. The proportional valve 118 may include a type of valve that is capable of modulating or dynamically adjusting a rate of flow of gas through the proportional valve 118, using digital or analog control, to maintain a pressure in the gas supply line 116, in the gas supply lines 112a-112c, and in the one or more lift pins 102a-102c. For example, the proportional valve 118 may be capable of varying the size of an opening through the proportional valve 118 to the gas supply line 116 (e.g., by a flow restrictor or another type of component that is capable of increasing or decreasing the size of the opening). The proportional valve 118 may be configured to selectively provide a supply flow of gas to the one or more lift pins 102a-102c or to purge gas from the one or more lift pins 102a-102c.

The proportional valve 118 may be capable of modulating or dynamically adjusting the supply flow of gas to the one or more lift pins 102a-102c to maintain a constant pressure (or near constant pressure) in the gas supply line 116, in the gas supply lines 112a-112c, and in the one or more lift pins 102a-102c when raising or extending the one or more lift pins 102a-102c. For example, the proportional valve 118 may initiate the supply of gas to the one or more lift pins 102a-102c through the gas supply line 116, the manifold 114, and the gas supply lines 112a-112c. The proportional valve 118 may initially supply the gas at a rate that causes the pressure in the gas supply line 116, in the gas supply lines 112a-112c, and in the one or more lift pins 102a-102c to ramp up or increase approximately to a pressure setting. Once the pressure of the gas in the gas supply line 116, in the gas supply lines 112a-112c, and in the one or more lift pins 102a-102c reaches the pressure setting (or is within a tolerance or threshold of the pressure setting), the proportional valve 118 may increase and/or decrease the rate at which the gas is supplied to the one or more lift pins 102a-102c to maintain the pressure of the gas in the gas supply lines 112a-112c, and in the one or more lift pins 102a-102c at the pressure setting (or within the tolerance or threshold of the pressure setting). The pressure setting may correspond to a pressure that satisfies the threshold pressure to cause the lift pins 102a-102c to raise or extend.

The proportional valve 118 may maintain the pressure of the gas in the gas supply line 116, in the gas supply lines 112*a*-112*c*, and in the one or more lift pins 102*a*-102*c* at a constant pressure while the one or more lift pins 102*a*-102*c* are being raised or extended and/or after the one or more lift pins 102*a*-102*c* have been raised or extended (e.g., prior to lowering or retracting the one or more lift pins 102*a*-102*c*). Maintaining the pressure of the gas in the gas supply line 116, in the gas supply lines 112*a*-112*c*, and in the one or more lift pins 102*a*-102*c* at a constant pressure while the one or more lift pins 102*a*-102*c* are raised or extended provides smooth and controlled movement of the lift pins 102*a*-102*c* which reduces or minimizes movement of the semiconductor wafer 108 when the semiconductor wafer 108 is raised off of the wafer stage 106. Maintaining the pressure of the gas in the gas supply line 116, in the gas supply lines 112*a*-112*c*, and in the one or more lift pins 102*a*-102*c* at a constant pressure after the one or more lift pins 102*a*-102*c* are raised or extended provides a consistent and repeatable starting pressure for lowering the semiconductor wafer 108 onto the wafer stage 106, which permits smooth and controlled movement of the lift pins 102*a*-102*c* when the semiconductor wafer 108 is lowered onto the wafer stage 106.

The proportional valve 118 may also be capable of modulating or dynamically adjusting the rate at which gas is purged or evacuated from the one or more lift pins 102*a*-102*c*, the gas supply lines 112*a*-112*c*, and/or the gas supply line 116 to maintain a constant pressure (or near constant pressure) in the gas supply line 116, in the gas supply lines 112*a*-112*c*, and in the one or more lift pins 102*a*-102*c* when lowering or retracting the lift pins 102*a*-102*c*. For example, the proportional valve 118 may initiate the purge or evacuation of gas from the one or more lift pins 102*a*-102*c* through the gas supply line 116, the manifold 114, and the gas supply lines 112*a*-112*c*. The proportional valve 118 may initially purge or evacuate the gas at a rate that causes the pressure in the gas supply line 116, in the gas supply lines 112*a*-112*c*, and in the one or more lift pins 102*a*-102*c* to ramp down or decrease approximately to a pressure setting. Once the pressure of the gas in the gas supply line 116, in the gas supply lines 112*a*-112*c*, and in the one or more lift pins 102*a*-102*c* reaches the pressure setting (or is within a tolerance or threshold of the pressure setting), the proportional valve 118 may increase and/or decrease the rate at which the gas is purged or evacuated from the one or more lift pins 102*a*-102*c* to maintain the pressure of the gas in the gas supply lines 112*a*-112*c*, and in the one or more lift pins 102*a*-102*c* at the pressure setting (or within the tolerance or threshold of the pressure setting). The pressure setting may correspond to a pressure that does not satisfy the threshold pressure to cause the lift pins 102*a*-102*c* to lower or retract.

The proportional valve 118 may supply a gas to the gas supply line 116 from gas stored in a storage tank 120 included in the wafer lift pin system 100. The storage tank 120 may include a tank, a drum, a storage container, a storage vessel, or another type of apparatus capable of storing gas in a pressurized state. The storage tank 120 may be pressurized at a particular pressure or pressure setting to minimize and/or prevent a drop in pressure in the gas supply line 116, in the gas supply lines 112*a*-112*c*, and/or in the lift pins 102*a*-102*c*. Moreover, the storage tank 120 may be pressurized at a particular pressure or pressure setting to satisfy a starting pressure for initial operation of the proportional valve 118 (e.g., when purging gas from or providing gas to the lift pins 102*a*-102*c*). In some implementations, the storage tank 120 may function as a buffer for the proportional valve 118 in that the storage tank 120 may be filled with a particular volume of gas or filled to a particular pressure prior to operation of the proportional valve 118 so that the supply of gas from the storage tank 120 to the proportional valve 118 is not depleted.

Gas in the storage tank 120 may be supplied to the proportional valve 118 through a gas supply line 122 between the storage tank 120 and the proportional valve 118. Gas may be purged or evacuated out of the storage tank 120, out of the gas supply line 116, out of the manifold 114, out of the gas supply lines 112*a*-112*c*, and out of the lift pins 102*a*-102*c* through a gas purge line 124. The gas purge line 124 permits the proportional valve 118 to vent gas out of the wafer lift pin system 100.

Gas may be supplied or provided to the storage tank 120 through one or more valves such a check valve 126 and a one-way solenoid valve 128. The check valve 126 may include a one-way valve that is configured to prevent gas in the storage tank 120 from backflowing out of the storage tank 120 through the one-way solenoid valve 128 when the one-way solenoid valve 128 is vented. The one-way solenoid valve 128 may include a valve that is controlled to start and stop the flow of gas into the wafer lift pin system 100. The one-way solenoid valve 128 may provide gas to the storage tank 120 through the check valve 126. The one-way solenoid valve 128 may further be configured to vent or purge gas from a portion of the wafer lift pin system 100 (e.g., the gas in the wafer lift pin system 100 before the check valve 126). Gas may be introduced into the wafer lift pin system 100 through a gas supply line 130 into the one-way solenoid valve 128. Gas may be vented or purged from the portion of the wafer lift pin system 100 through a gas purge line 132 through the one-way solenoid valve 128. Gas may be supplied from the one-way solenoid valve 128 to the storage tank 120 through a plurality of gas supply lines 134 that couple the one-way solenoid valve 128, the check valve 126, and the storage tank 120.

The gas supply lines 112*a*-112*c*, the gas supply line 116, the gas supply line 122, the gas purge line 124, the gas supply line 130, the gas purge line 132, and the gas supply lines 134 may each include pipes, fittings, and/or other types of plumbing fixtures that are capable of transferring a pressurized gas to and from the various components and locations included in the wafer lift pin system 100.

The wafer lift pin system 100 may include a controller 136 to automatically control various operational aspects of the wafer lift pin system 100. The controller 136 may include a processor, a microprocessor, a programmable logic controller (PLC), a computing device, or a device or system that includes one or more of these components. The controller 136 may be configured to receive sensor data from various sensors included in the wafer lift pin system 100, such as a pressure sensor 138, a pressure sensor 140, and/or another sensor. The controller 136 may be configured to determine rise times for the one or more lift pins 102*a*-102*c*, determine fall times for the one or more lift pins 102*a*-102*c*, determine pressure settings, pressure tolerances, and/or pressure thresholds for the proportional valve 118, and/or may be configured to automatically perform other operations in the wafer lift pin system 100 based on the sensor data and/or based on other data.

The pressure sensor 138 may be located in and/or along the gas supply lines 134 between the one-way solenoid valve 128 and the check valve 126. The pressure sensor 138 may be configured to generate pressure sensor data associated with the pressure of gas in the gas supply lines 134 between the one-way solenoid valve 128 and the check valve 126. The pressure sensor 138 may be further configured to automatically transmit and/or provide the pressure sensor data to the controller 136 and/or based on receiving a request from the controller 136 for the pressure sensor data. The pressure sensor 138 may provide the pressure sensor data to the controller 136 over a direct communication link and/or over a network such as a controller network, a wireless network, or a public or private network. The pressure sensor data may include an analog signal that is generated based on the pressure, a digital signal that is converted from the analog signal, a digital communication including one or more packets of information, and/or another form or type of electronic information.

The controller 136 may receive the pressure sensor data from the pressure sensor 138. The controller 136 may determine the pressure of the gas in the gas supply lines 134 between the one-way solenoid valve 128 and the check valve 126. The controller 136 may determine, based on the pressure, whether gas is being supplied to the wafer lift pin system 100 or purged from the wafer lift pin system 100. For example, the controller 136 may determine that gas is being supplied to the wafer lift pin system 100 based on determining that the pressure of the gas in the gas supply lines 134 between the one-way solenoid valve 128 and the check valve 126 satisfies a pressure threshold. As another example, the controller 136 may determine that gas is being supplied to the wafer lift pin system 100 based on determining that the pressure of the gas in the gas supply lines 134 between the one-way solenoid valve 128 and the check valve 126 is increasing and/or is increasing at a rate that satisfies a threshold.

As another example, the controller 136 may determine that gas is being purged from the wafer lift pin system 100 based on determining that the pressure of the gas in the gas supply lines 134 between the one-way solenoid valve 128 and the check valve 126 does not satisfy a pressure threshold. As another example, the controller 136 may determine that gas is being purged from the wafer lift pin system 100 based on determining that the pressure of the gas in the gas supply lines 134 between the one-way solenoid valve 128 and the check valve 126 is decreasing and/or is decreasing at a rate that satisfies a threshold.

The controller 136 may selectively cause the proportional valve 118 to supply gas from the storage tank 120 to the one or more lift pins 102a-102c to raise or extend the one or more lift pins 102a-102c, or to purge gas from the one or more lift pins 102a-102c to lower or retract the one or more lift pins 102a-102c. For example, the controller 136 may cause the proportional valve 118 to supply gas from the storage tank 120 to the one or more lift pins 102a-102c to raise or extend the one or more lift pins 102a-102c based on determining that gas is being supplied to the wafer lift pin system 100. As another example, the controller 136 may cause the proportional valve 118 to purge gas from the one or more lift pins 102a-102c to lower or retract the one or more lift pins 102a-102c based on determining that gas is being purged from the wafer lift pin system 100.

The controller 136 may cause the proportional valve 118 to supply gas from the storage tank 120 to the one or more lift pins 102a-102c at a particular pressure by transmitting or providing, to the proportional valve 118, an indication of a pressure setting (which satisfies the pressure threshold for the one or more lift pins 102a-102c to cause the one or more lift pins 102a-102c to raise or extend). The proportional valve 118 may receive the indication of the pressure setting and may modulate the supply of the gas to the one or more lift pins 102a-102c such that the pressure of the gas is within a threshold or a tolerance of the pressure setting. The proportional valve 118 may determine and monitor the pressure of the gas in the gas supply line 116, in the gas supply lines 112a-112c, and/or in the cylinders of the lift pins 102a-102c based on pressure sensor data generated by the pressure sensor 140. The pressure sensor 140 may further transmit or provide (or the proportional valve 118 may transmit or provide) the pressure sensor data generated by the pressure sensor 140 to the controller 136.

The controller 136 may cause the proportional valve 118 to purge gas from the one or more lift pins 102a-102c at a particular pressure by transmitting or providing, to the proportional valve 118, an indication of a pressure setting (which does not satisfy the pressure threshold for the one or more lift pins 102a-102c to cause the one or more lift pins 102a-102c to lower or retract). The proportional valve 118 may receive the indication of the pressure setting and may dynamically adjust the rate at which gas is purged from the one or more lift pins 102a-102c such that the pressure of the gas is within a threshold or a tolerance of the pressure setting.

The controller 136 may determine a pressure setting for raising or extending the one or more lift pins 102a-102c to achieve a particular rise time for raising the semiconductor wafer 108 up off of the wafer stage 106. The controller 136 may determine a pressure setting for lowering or retracting the one or more lift pins 102a-102c to achieve a particular fall time for lowering the semiconductor wafer 108 onto the wafer stage 106. The controller 136 may identify or select a rise time or a fall time to achieve smooth and controlled motion of the semiconductor wafer 108 and/or to minimize vibrations and displacement of the semiconductor wafer 108 on the one or more lift pins 102a-102c. Example rise times and/or falls times may be included in a range of approximately 3 seconds to approximately 5 seconds, a range of approximately 4 seconds to approximately 6 seconds, or another example range.

The controller 136 may determine a pressure setting based on historical data associated with the one or more lift pins 102a-102c and/or the wafer lift pin system 100, based on one or more attributes of the one or more lift pins 102a-102c, and/or other factors or parameters. As an example, the controller 136 may determine a pressure setting for raising or extending the one or more lift pins 102a-102c based on historical data indicating historical rise times and associated pressures for the one or more lift pins 102a-102c. In these examples, the controller 136 may receive data from the proportional valve 118 indicating rise times and associated pressures in the one or more lift pins 102a-102c after each cycle of the one or more lift pins 102a-102c or after a plurality of cycles. The controller 136 may store the historical data in a data store and may use a machine learning model such as a regression model, trained on the historical data, to determine the pressure setting. Inputs to the machine learning model may include a target rise time, a spring life or a quantity of cycles for the one or more lift pins 102a-102c (e.g., to compensate for elastic fatigue of the springs included in the one or more lift pins 102a-102c), and/or other parameters. The output from the machine learning model may include an estimated pressure setting for raising or extending the one or more lift pins 102a-102c. Feedback from the cycle in which the estimated pressure setting was used to raise or extend the one or more lift pins 102a-102c may be used to train and refine the machine learning model to increase the accuracy of the machine learning model. The controller 136 may use similar techniques to determine a pressure setting for lowering or retracting the one or more lift pins 102a-102c.

As indicated above, FIGS. 1A and 1B are provided as examples. Other examples may differ from what is described with regard to FIGS. 1A and 1B.

FIGS. 2A-2D are diagrams of an example implementation 200 described herein. The example implementation 200 may include an example of raising or extending the one or more lift pins 102a-102c to raise or lift the semiconductor wafer 108 off of the wafer stage 106. The wafer lift pin system 100 may raise or lift the semiconductor wafer 108 off of the wafer stage 106 so that a wafer transport tool may retrieve the semiconductor wafer 108 from the processing chamber 104 and transfer the semiconductor wafer 108 to a transport carrier or another location.

Figure 2A:
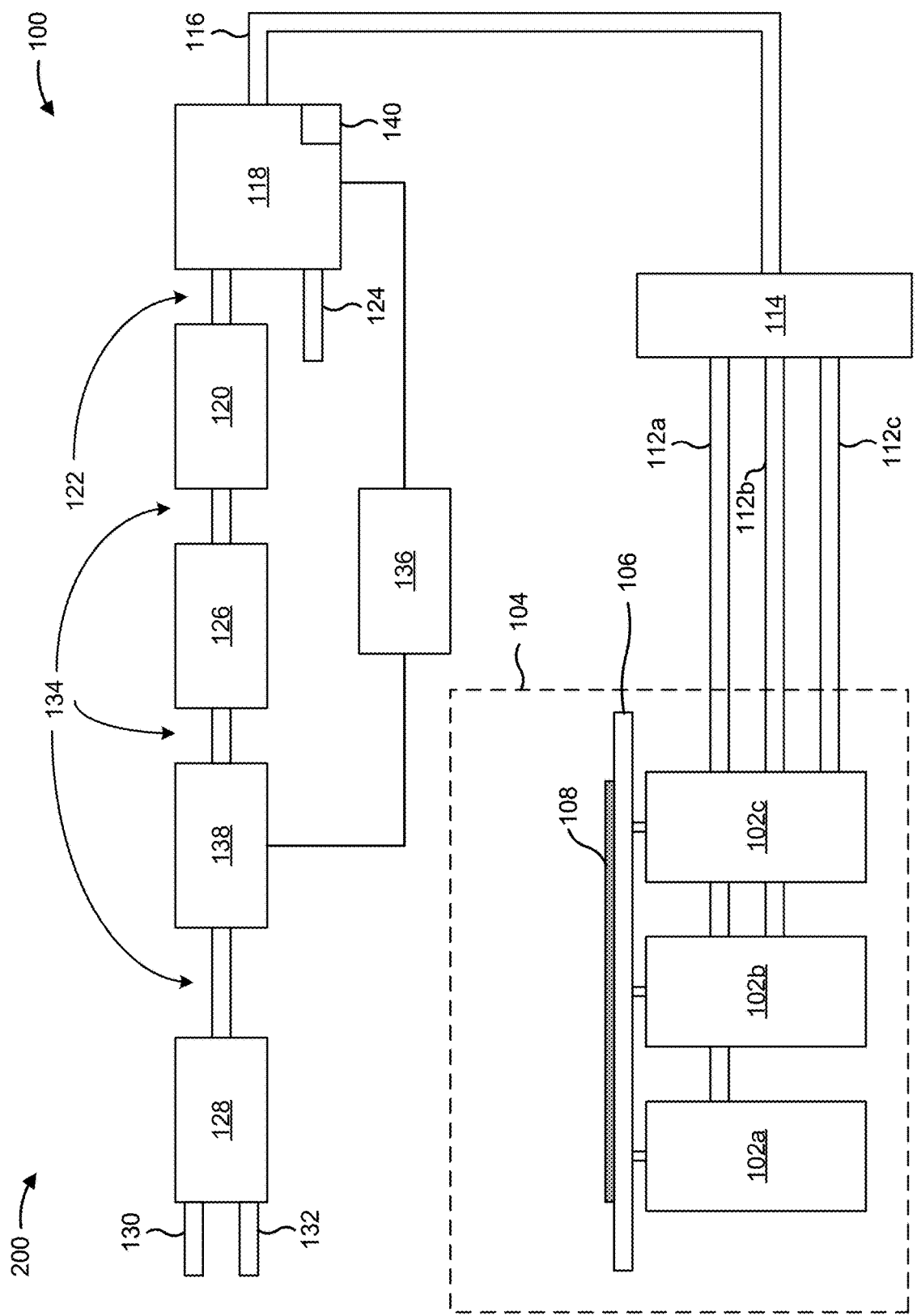
FIGS. 2A-2D are diagrams of an example implementation described herein.

As shown in FIG. 2A, the wafer lift pin system 100 may be in the retracted configuration (or a lowered configuration) illustrated in FIG. 1A. As shown in FIG. 2A, the one or more lift pins 102a-102c are retracted under or below the top surface of the wafer stage 106 such that the semiconductor wafer 108 is resting on the wafer stage 106 in the retracted configuration.

Figure 2B:
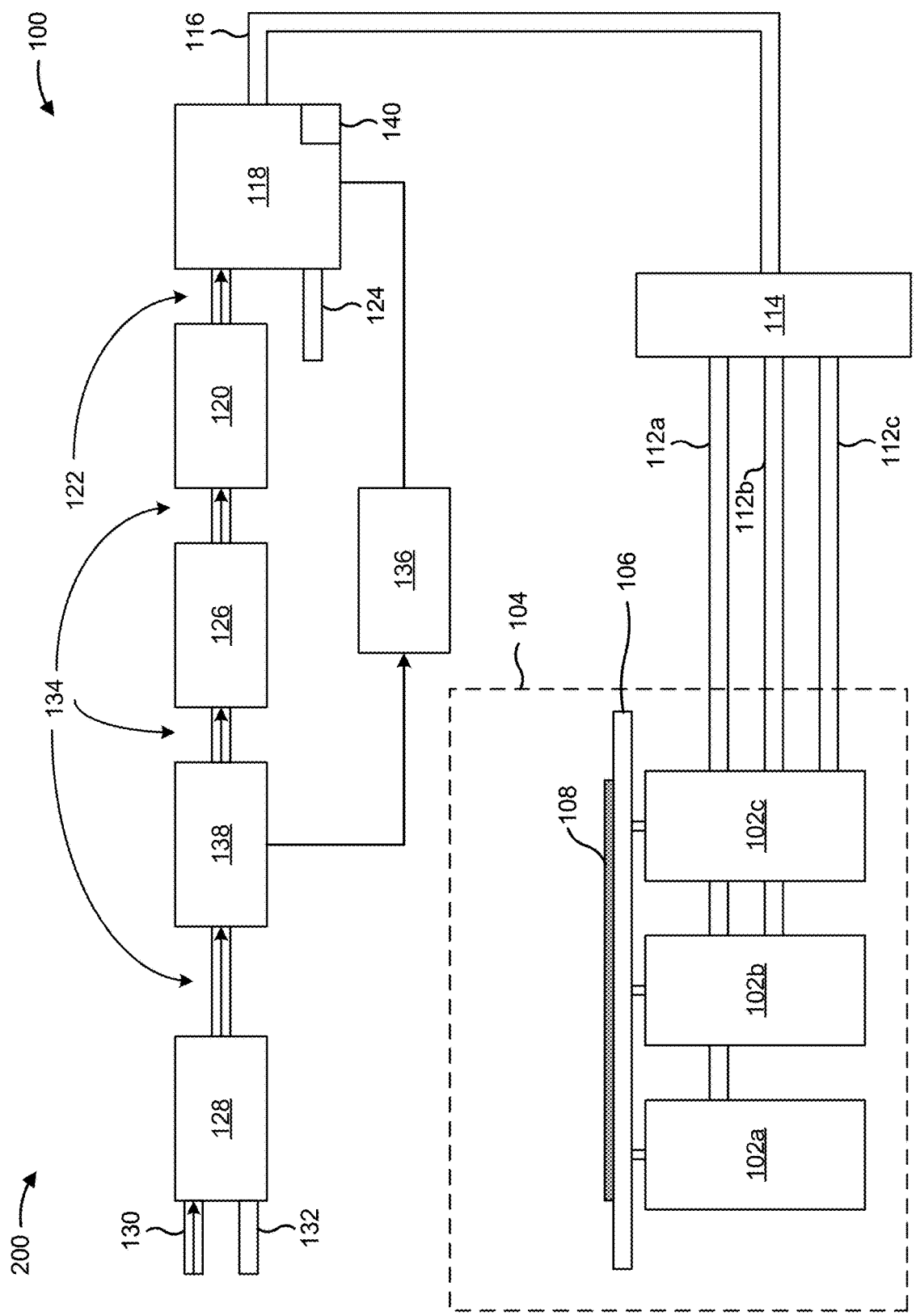

As shown in FIG. 2B, the one-way solenoid valve 128 may be opened such that gas is introduced into the wafer lift pin system 100. The gas may flow through the gas supply line 130, through the one-way solenoid valve 128, through the gas supply lines 134, through the pressure sensor 138, and through the check valve 126 into the storage tank 120. The pressure sensor 138 may generate pressure sensor data associated with a pressure of the gas in the gas supply lines 134. The pressure sensor 138 may provide the pressure sensor data to the controller 136.

The controller 136 may receive the pressure sensor data and may determine, based on the pressure sensor data, that gas is being supplied to the wafer lift pin system 100. For example, the controller 136 may determine that gas is being supplied to the wafer lift pin system 100 based on determining that the pressure satisfies a pressure threshold.

The controller 136 may determine, based on determining that gas is being supplied to the wafer lift pin system 100, a pressure setting for raising or extending the one or more lift pins 102a-102c. The controller 136 may determine the pressure setting using one or more of the techniques described above in connection with FIGS. 1A and 1B. For example, the controller 136 may determine the pressure setting to achieve a particular rise time for raising the semiconductor wafer 108 above the wafer stage 106.

Figure 2C:
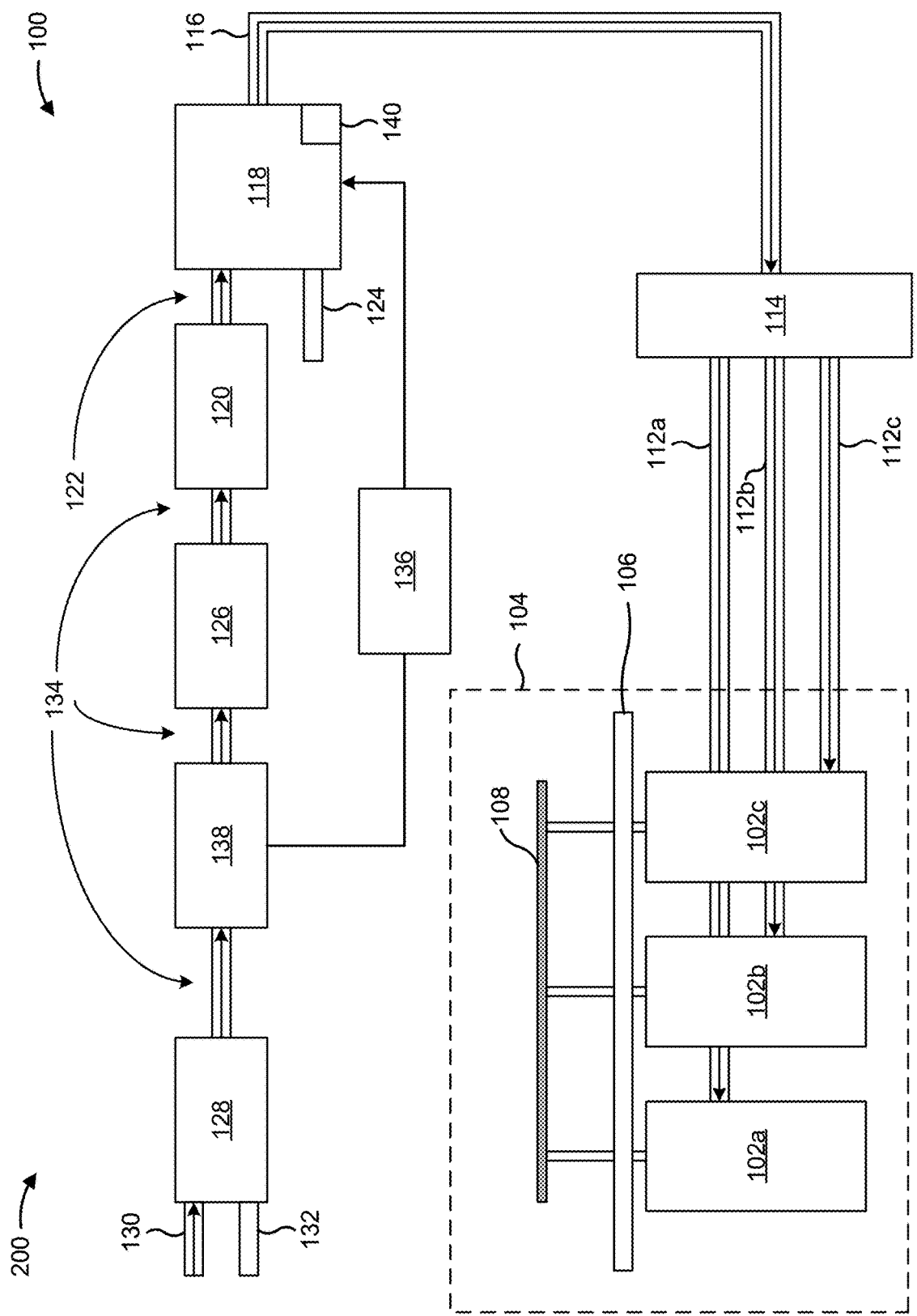

As shown in FIG. 2C, the controller 136 may transmit an indication of the pressure setting to the proportional valve 118. The proportional valve 118 may receive the indication of the pressure setting and may supply gas to the one or more lift pins 102a-102c from the storage tank 120 through the gas supply line 122, the gas supply line 116, the manifold 114, and the gas supply lines 112a-112c to cause the one or more lift pins 102a-102c to lift or raise the semiconductor wafer 108 off of the wafer stage 106. The proportional valve 118 may modulate or dynamically adjust the supply of the gas to the one or more lift pins 102a-102c to achieve and maintain the pressure in the gas supply line 116, the gas supply lines 112a-112c, and/or in the one or more lift pins 102a-102c approximately at the pressure setting. The proportional valve 118 may monitor the pressure based on pressure sensor data generated by the pressure sensor 140 and may adjust the pressure to achieve the pressure setting based on the pressure sensor data.

Figure 2D:
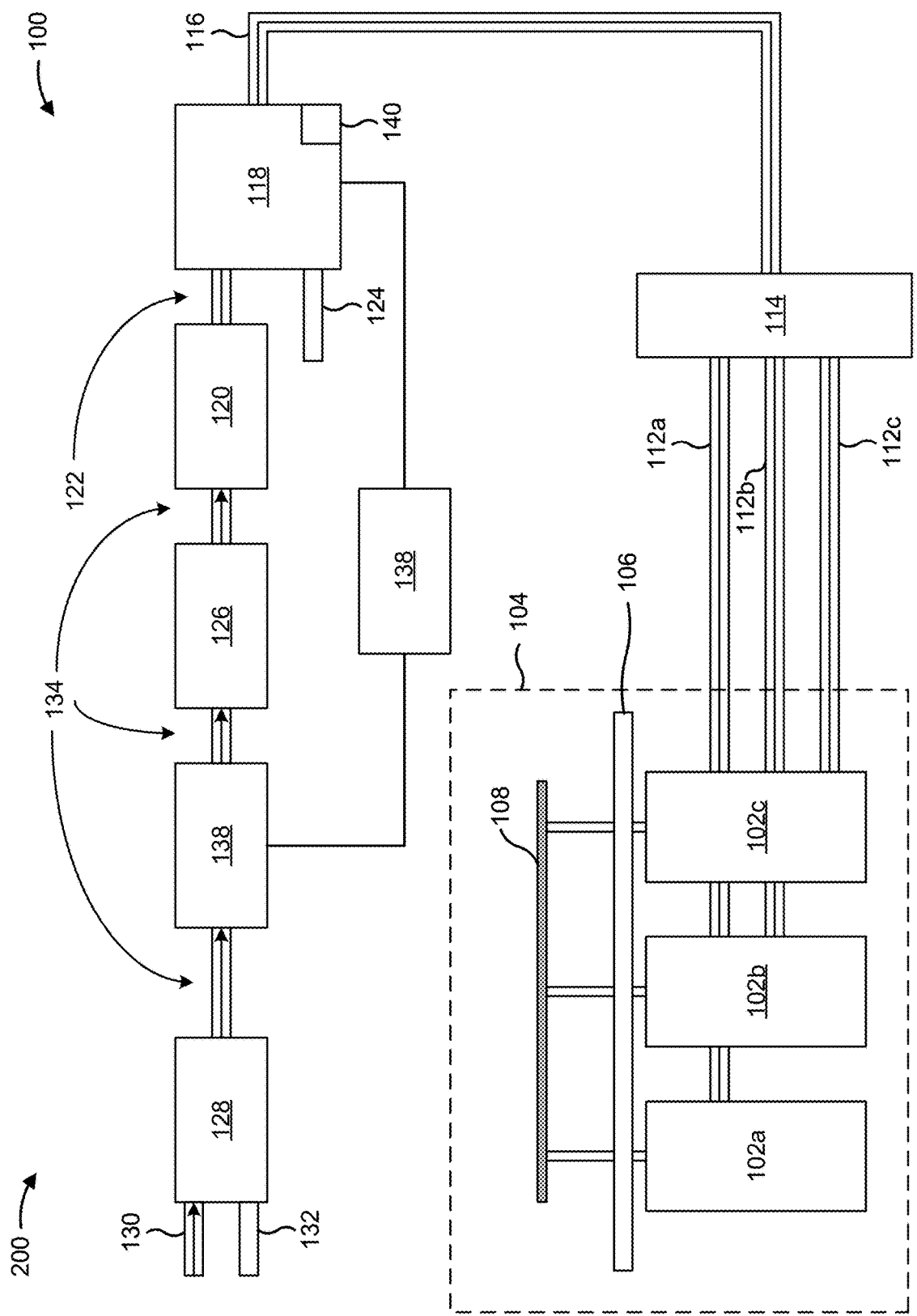

As shown in FIG. 2D, the proportional valve 118 may maintain the pressure in the gas supply line 116, the gas supply lines 112a-112c, and/or in the one or more lift pins 102a-102c approximately at the pressure setting after the one or more lift pins 102a-102c (and the semiconductor wafer 108) have been raised or extended to the extended configuration (or the raised configuration) illustrated in FIG. 2C. Gas may continue to be supplied to the wafer lift pin system 100 through the one-way solenoid valve 128 to the storage tank 120 to maintain the pressure and the supply of gas in the storage tank 120. The check valve 126 may prevent gas from backflowing out of the storage tank 120.

As indicated above, FIGS. 2A-2D are provided as an example. Other examples may differ from what is described with regard to FIGS. 2A-2D.

FIGS. 3A-3D are diagrams of an example implementation 300 described herein. The example implementation 300 may include an example of lowering or retracting the one or more lift pins 102a-102c to lower the semiconductor wafer 108 onto the wafer stage 106. The wafer lift pin system 100 may lower the semiconductor wafer 108 onto the wafer stage 106 so that the semiconductor wafer 108 may be secured on the wafer stage 106 for processing in the processing chamber 104.

Figure 3A:
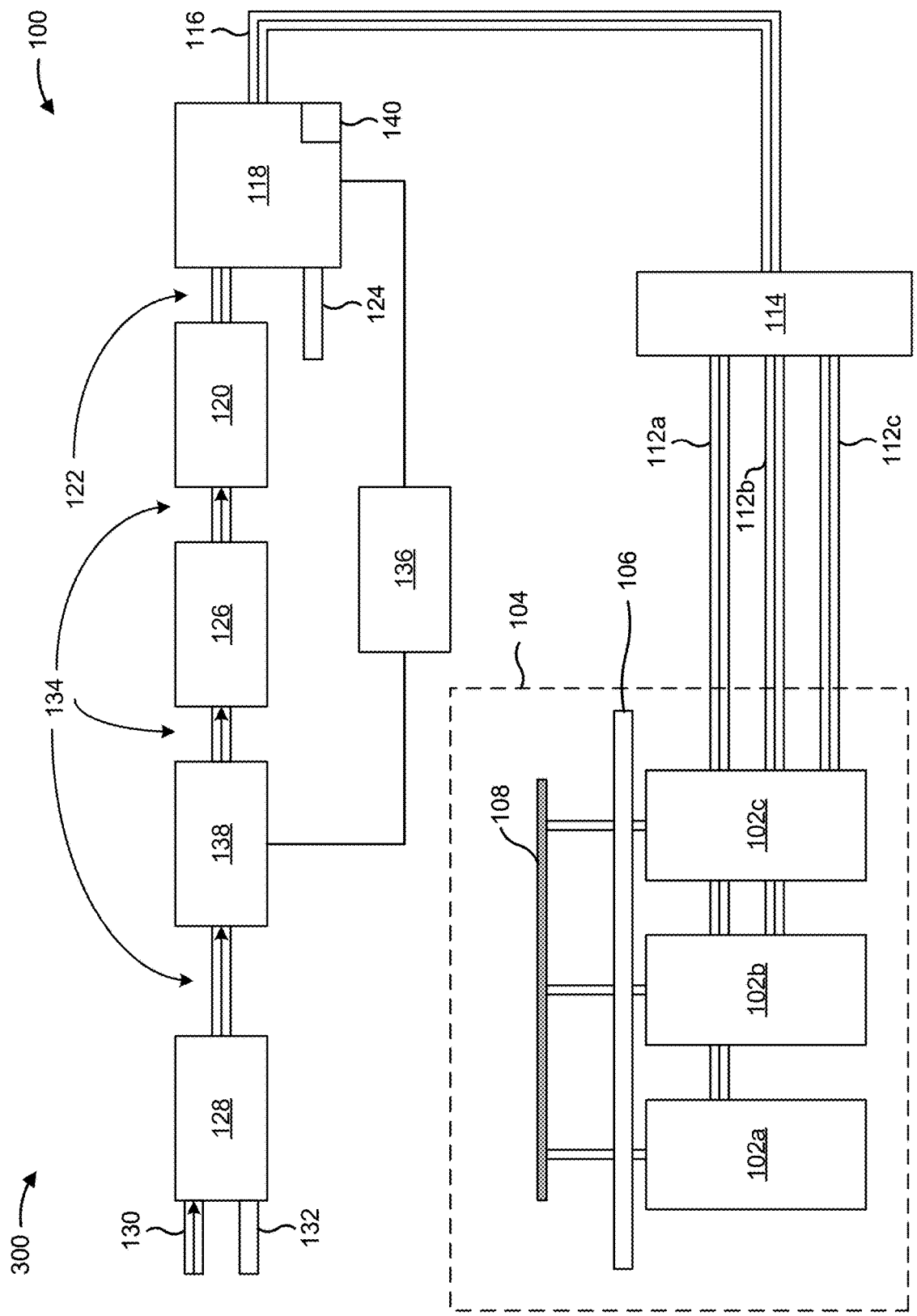
FIGS. 3A-3D are diagrams of an example implementation described herein.

As shown in FIG. 3A, the proportional valve 118 may maintain the pressure in the gas supply line 116, the gas supply lines 112a-112c, and/or in the one or more lift pins 102a-102c approximately at the pressure setting in the extended configuration (or the raised configuration) illustrated in FIG. 3A. Gas may be supplied to the wafer lift pin system 100 through the one-way solenoid valve 128 to the storage tank 120 to maintain the pressure and the supply of gas in the storage tank 120. The check valve 126 may prevent gas from backflowing out of the storage tank 120.

Figure 3B:
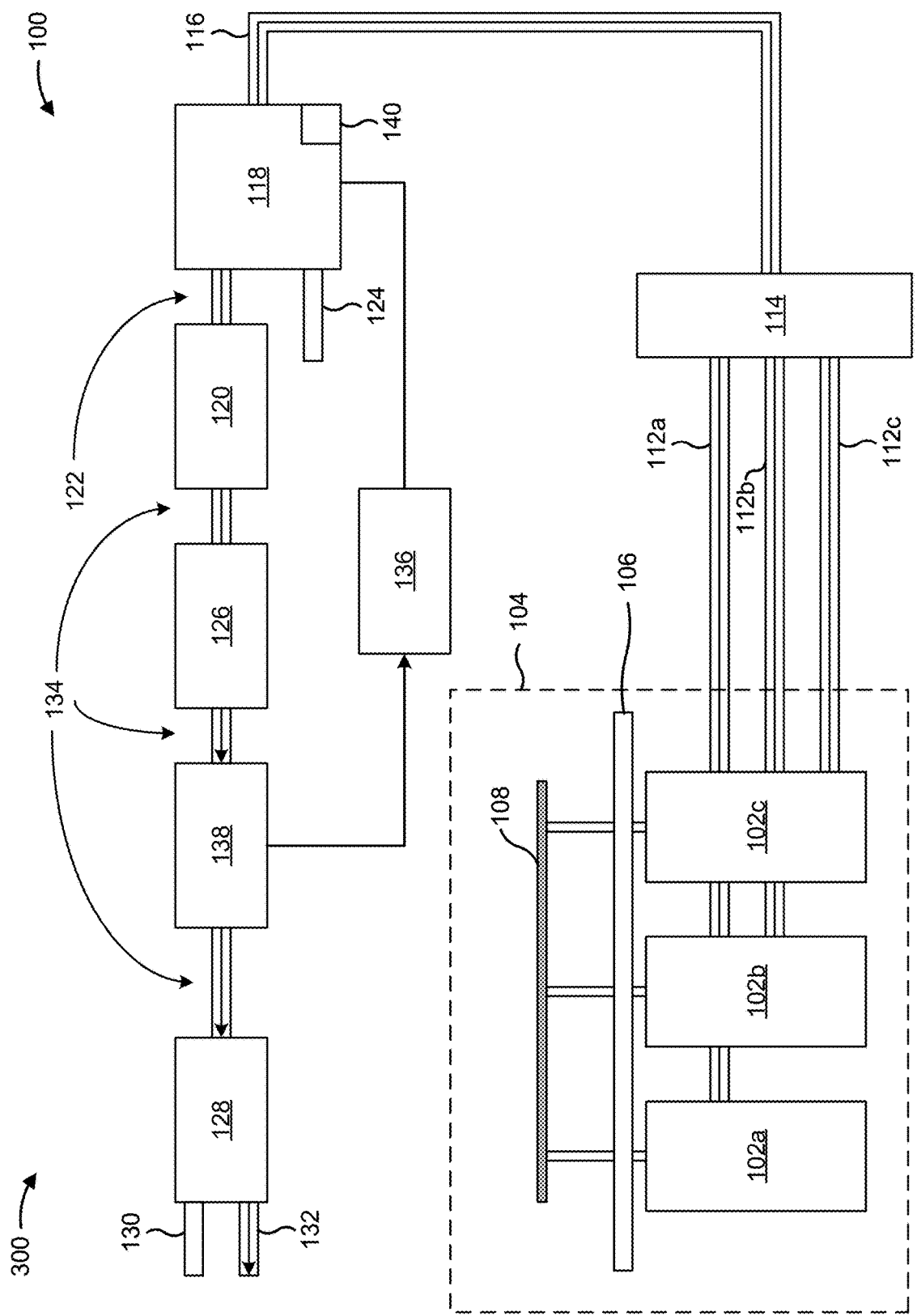

As shown in FIG. 3B, the gas purge line 132 out of the one-way solenoid valve 128 may be opened such that gas is purged or vented out of the wafer lift pin system 100. The gas may flow through the gas supply lines 134 from the check valve 126 through the one-way solenoid valve 128, and through the gas purge line 132. The check valve 126 may prevent gas from backflowing out of the storage tank 120 such that the pressure and gas supply in the storage tank 120 supports initial operation of the proportional valve 118. The pressure sensor 138 may generate pressure sensor data associated with a pressure of the gas in the gas supply lines 134. The pressure sensor 138 may provide the pressure sensor data to the controller 136.

The controller 136 may receive the pressure sensor data and may determine, based on the pressure sensor data, that gas is being purged or vented out of the wafer lift pin system 100. For example, the controller 136 may determine that gas is being purged or vented out of the wafer lift pin system 100 based on determining that the pressure does not satisfy a pressure threshold.

The controller 136 may determine, based on determining that gas is being purged or vented out of the wafer lift pin system 100, a pressure setting for lowering or retracting the one or more lift pins 102a-102c. The controller 136 may determine the pressure setting using one or more of the techniques described above in connection with FIGS. 1A and 1B. For example, the controller 136 may determine the pressure setting to achieve a particular fall time for lowering the semiconductor wafer 108 onto the wafer stage 106.

Figure 3C:
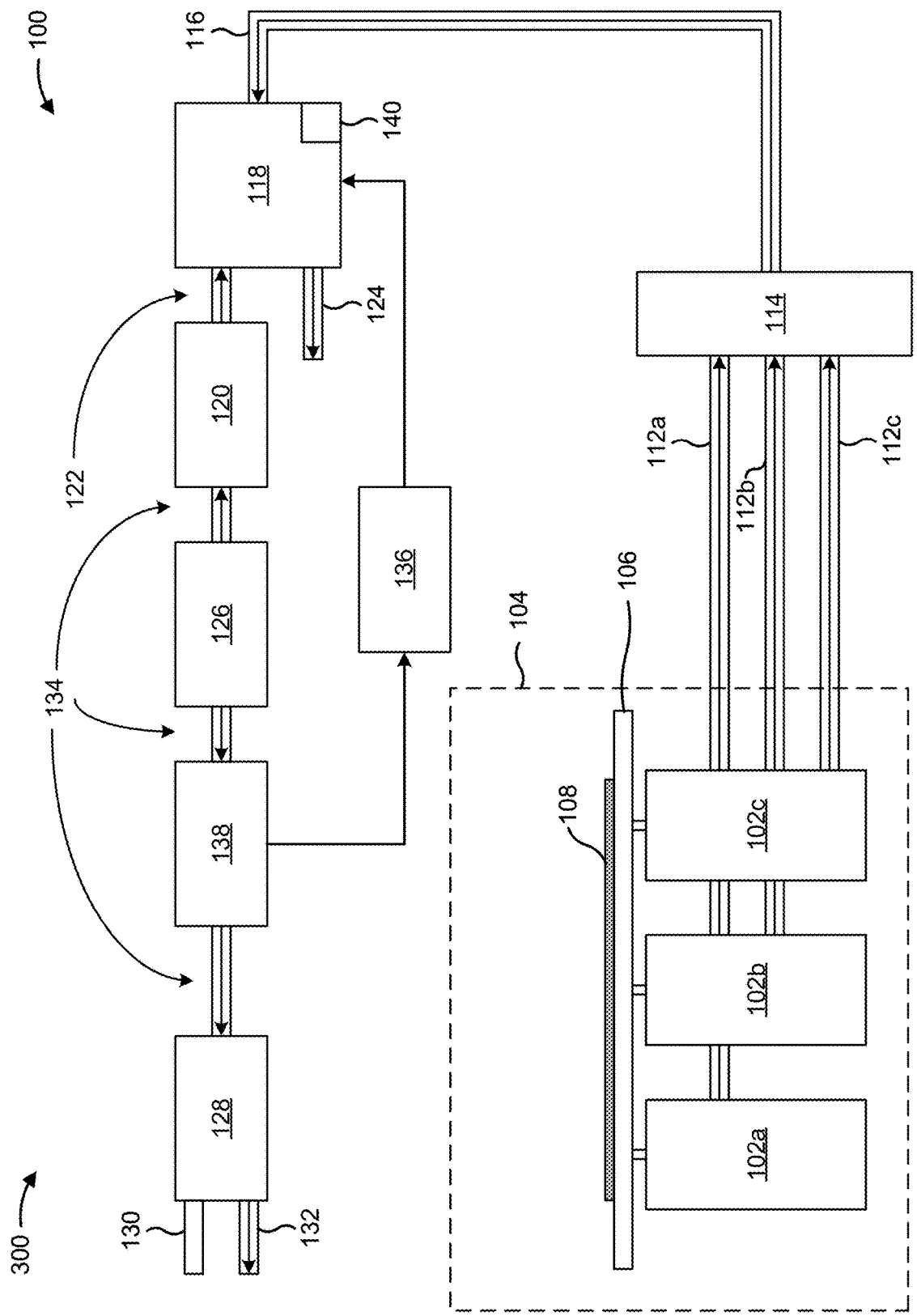

As shown in FIG. 3C, the controller 136 may transmit an indication of the pressure setting to the proportional valve 118. The proportional valve 118 may receive the indication of the pressure setting and may vent or purge gas from the one or more lift pins 102a-102c through the gas supply line 116, the manifold 114, and the gas supply lines 112a-112c to cause the one or more lift pins 102a-102c to lower or retract the semiconductor wafer 108 onto the wafer stage 106. The proportional valve 118 may modulate or dynamically adjust the rate at which the gas is purged from the one or more lift pins 102a-102c to achieve and maintain the pressure in the gas supply line 116, the gas supply lines 112a-112c, and/or in the one or more lift pins 102a-102c approximately at the pressure setting. The proportional valve 118 may monitor the pressure based on pressure sensor data generated by the pressure sensor 140 and may adjust the pressure to achieve the pressure setting based on the pressure sensor data. The proportional valve 118 may purge or vent the gas through the gas purge line 124.

Figure 3D:
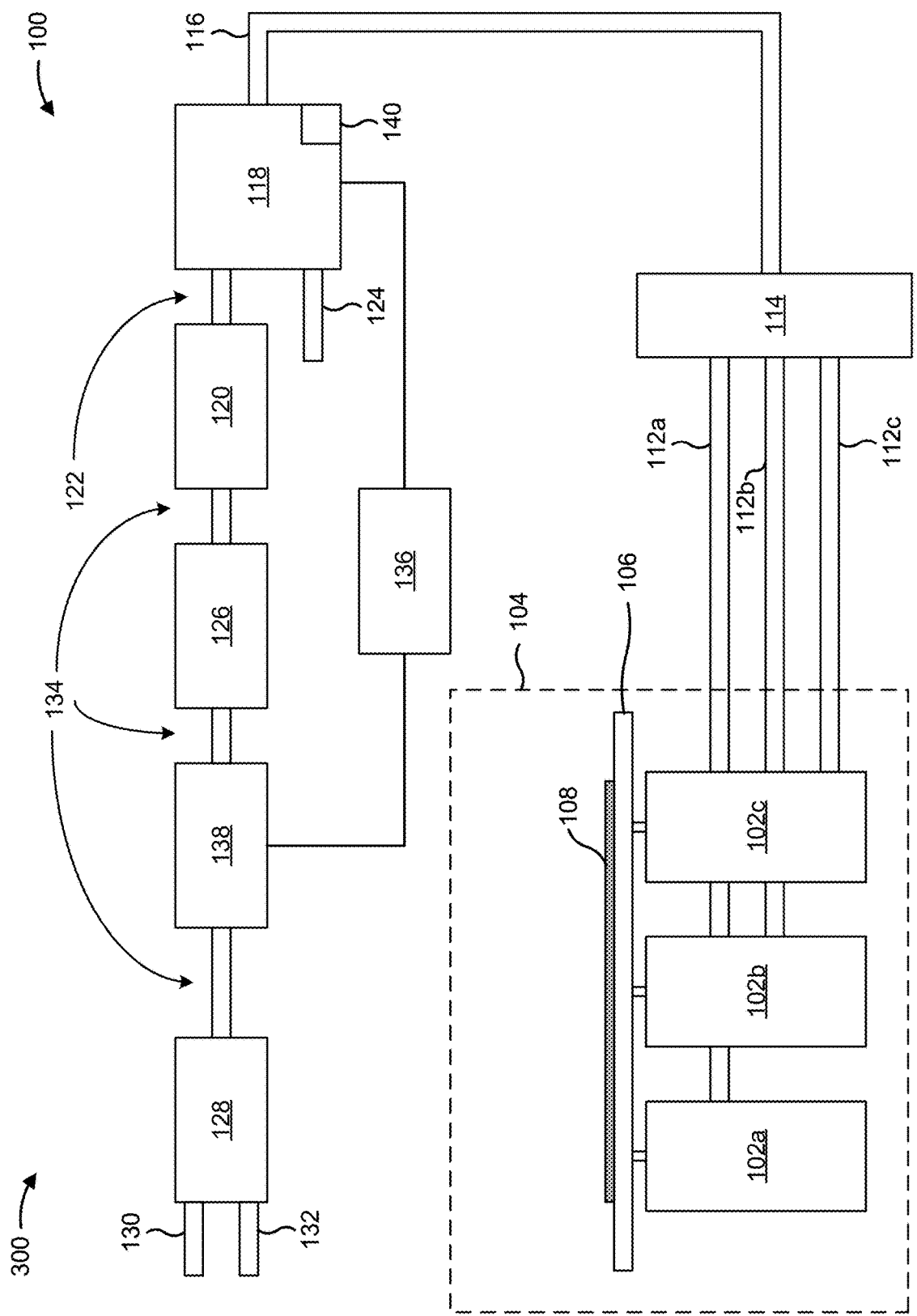

As shown in FIG. 3D, the wafer lift pin system 100 may be in the retracted configuration (or a lowered configuration) illustrated in FIG. 3C. As shown in FIG. 3D, the one or more lift pins 102a-102c are retracted under or below the top surface of the wafer stage 106 such that the semiconductor wafer 108 is resting on the wafer stage 106 in the retracted configuration. Accordingly, the semiconductor wafer 108 may be secured by the wafer stage 106 and processed through one or more semiconductor processing operations in the processing chamber 104.

As indicated above, FIGS. 3A-3D are provided as an example. Other examples may differ from what is described with regard to FIGS. 3A-3D.

Figure 4A:
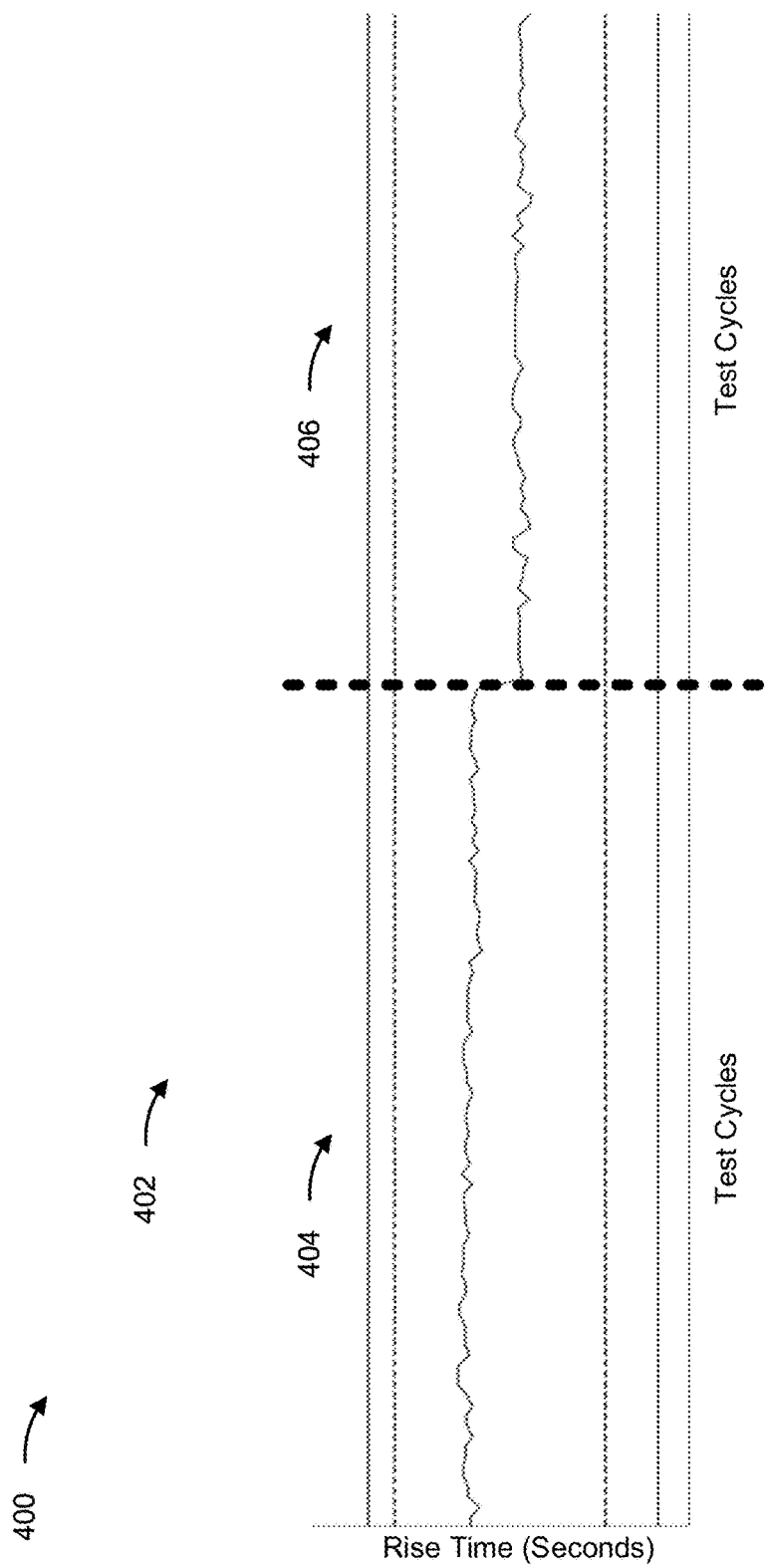
FIGS. 4A and 4B are diagrams of example wafer lift pin system test cycle data.
Figure 4B:
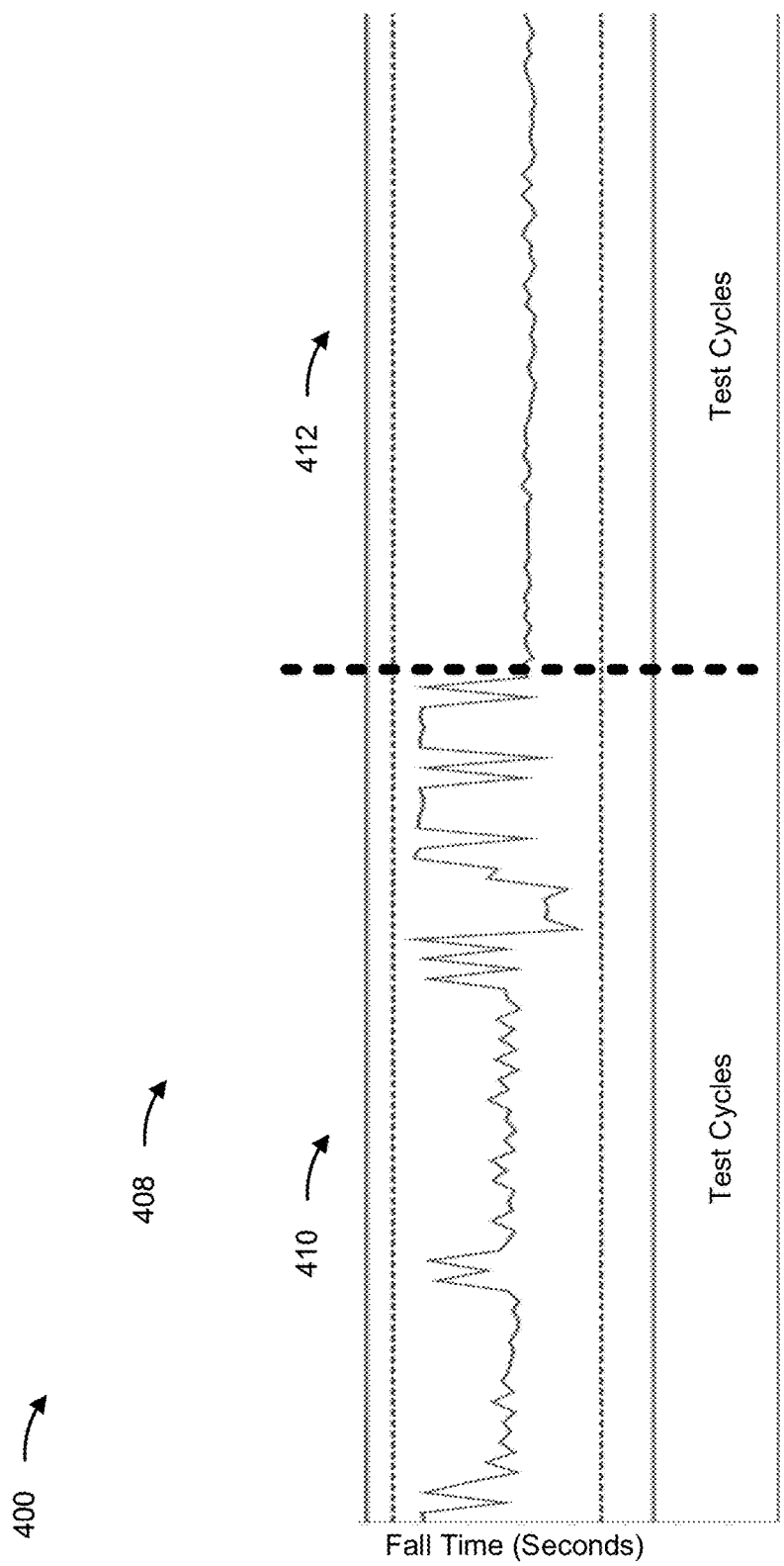

FIGS. 4A and 4B are diagrams of example wafer lift pin system test cycle data 400. FIG. 4A illustrates a plot 402 of example rise times of the wafer lift pin system test cycle data 400. Subsection 404 illustrates rise times for a plurality of test cycles for a wafer lift pin system in which gas is supplied directly to lift pins, and subsection 406 illustrates rise times for a plurality of test cycles for the wafer lift pin system 100 in which gas is supplied to the lift pins 102a-102c through the pressure sensor 138, the check valve 126, the storage tank 120, and the proportional valve 118 (various aspects of which are controlled by the controller 136). As shown in FIG. 4A, the wafer lift pin system 100 is capable of reducing rise times relative to the wafer lift pin system associated with the subsection 404. In particular, the controller 136 is capable of monitoring various operating parameters of the wafer lift pin system 100 described above to determine efficient and lower rise times for the lift pins 102a-102c.

FIG. 4B illustrates a plot 408 of example fall times of the wafer lift pin system test cycle data 400. Subsection 410 illustrates fall times for a plurality of test cycles for a wafer lift pin system in which gas is supplied directly to lift pins, and subsection 412 illustrates fall times for a plurality of test cycles for the wafer lift pin system 100 in which gas is supplied to the lift pins 102a-102c through the pressure sensor 138, the check valve 126, the storage tank 120, and the proportional valve 118 (various aspects of which are controlled by the controller 136). As shown in FIG. 4B, the wafer lift pin system 100 is capable of maintaining fall times across a plurality of test cycles near a target fall time. Accordingly, the wafer lift pin system 100 is capable of stabilizing and consistently repeating fall times.

As indicated above, FIGS. 4A and 4B are provided as examples. Other examples may differ from what is described with regard to FIGS. 4A and 4B.

Figure 5:
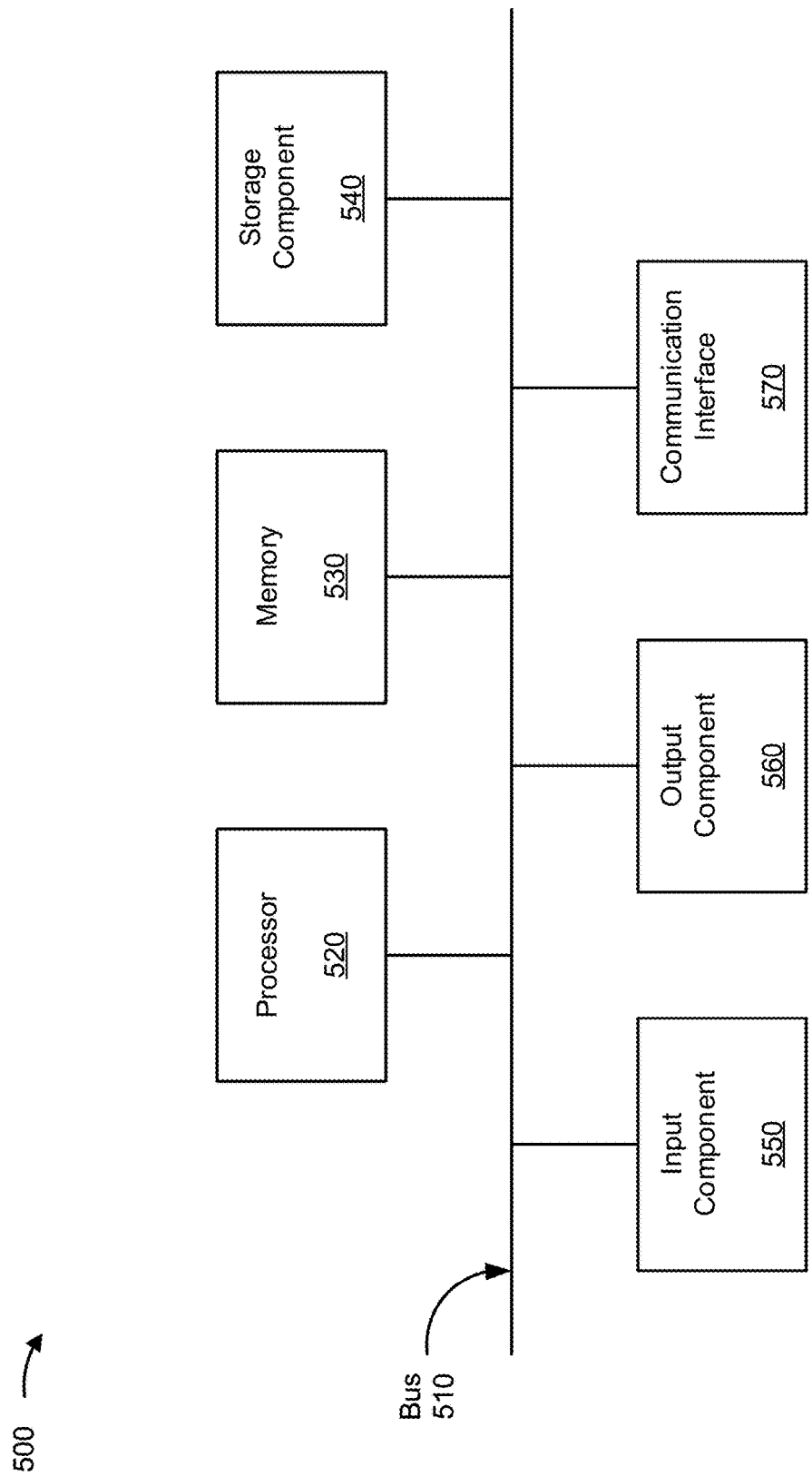
FIG. 5 is a diagram of example components of one or more devices of FIGS. 1A and 1B.

FIG. 5 is a diagram of example components of a device 500, which may correspond to the proportional valve 118, controller 136, the pressure sensor 138, and/or the pressure sensor 140. In some implementations, the proportional valve 118, controller 136, the pressure sensor 138, and/or the pressure sensor 140 may include one or more devices 500 and/or one or more components of device 500. As shown in FIG. 5, device 500 may include a bus 510, a processor 520, a memory 530, a storage component 540, an input component 550, an output component 560, and a communication component 570.

Bus 510 includes a component that enables wired and/or wireless communication among the components of device 500. Processor 520 includes a central processing unit, a graphics processing unit, a microprocessor, a controller, a microcontroller, a digital signal processor, a field-programmable gate array, an application-specific integrated circuit, and/or another type of processing component. Processor 520 is implemented in hardware, firmware, or a combination of hardware and software. In some implementations, processor 520 includes one or more processors capable of being programmed to perform a function. Memory 530 includes a random access memory, a read only memory, and/or another type of memory (e.g., a flash memory, a magnetic memory, and/or an optical memory).

Storage component 540 stores information and/or software related to the operation of device 500. For example, storage component 540 may include a hard disk drive, a magnetic disk drive, an optical disk drive, a solid state disk drive, a compact disc, a digital versatile disc, and/or another type of non-transitory computer-readable medium. Input component 550 enables device 500 to receive input, such as user input and/or sensed inputs. For example, input component 550 may include a touch screen, a keyboard, a keypad, a mouse, a button, a microphone, a switch, a sensor, a global positioning system component, an accelerometer, a gyroscope, and/or an actuator. Output component 560 enables device 500 to provide output, such as via a display, a speaker, and/or one or more light-emitting diodes. Communication component 570 enables device 500 to communicate with other devices, such as via a wired connection and/or a wireless connection. For example, communication component 570 may include a receiver, a transmitter, a transceiver, a modem, a network interface card, and/or an antenna.

Device 500 may perform one or more processes described herein. For example, a non-transitory computer-readable medium (e.g., memory 530 and/or storage component 540) may store a set of instructions (e.g., one or more instructions, code, software code, and/or program code) for execution by processor 520. Processor 520 may execute the set of instructions to perform one or more processes described herein. In some implementations, execution of the set of instructions, by one or more processors 520, causes the one or more processors 520 and/or the device 500 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 5 are provided as an example. Device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

Figure 6:
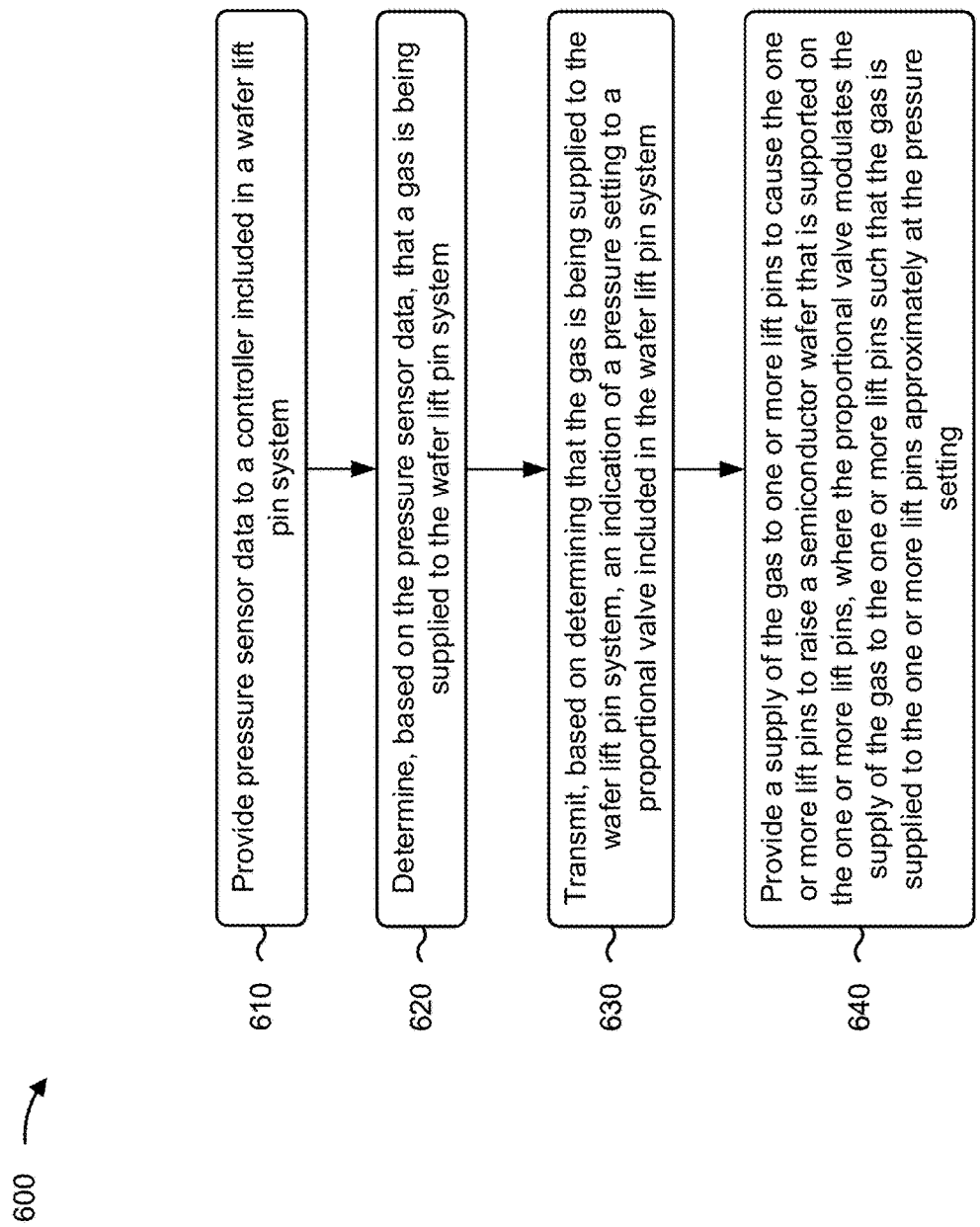
FIGS. 6 and 7 are flowcharts of example processes relating to operating a wafer lift pin system.

FIG. 6 is a flowchart of an example process 600 associated with operating a wafer lift pin system. In some implementations, one or more process blocks of FIG. 6 may be performed by one or more devices of a wafer lift pin system (e.g., one or more of the one or more lift pins 102a-102c, the manifold 114, the proportional valve 118, the storage tank 120, the check valve 126, the one-way solenoid valve 128, the controller 136, the pressure sensor 138, and/or the pressure sensor 140). Additionally, or alternatively, one or more process blocks of FIG. 6 may be performed by one or more components of device 500, such as processor 520, memory 530, storage component 540, input component 550, output component 560, and/or communication component 570.

As shown in FIG. 6, process 600 may include providing pressure sensor data to a controller included in a wafer lift pin system (block 610). For example, the pressure sensor 138 may provide pressure sensor data to the controller 136 included in the wafer lift pin system 100, as described above.

As further shown in FIG. 6, process 600 may include determining, based on the pressure sensor data, that a gas is being supplied to the wafer lift pin system (block 620). For example, the controller 136 may determine, based on the pressure sensor data, that a gas is being supplied to the wafer lift pin system 100, as described above.

As further shown in FIG. 6, process 600 may include transmitting, based on determining that the gas is being supplied to the wafer lift pin system, an indication of a pressure setting to a proportional valve included in the wafer lift pin system (block 630). For example, the controller 136 may transmit, based on determining that the gas is being supplied to the wafer lift pin system 100, an indication of a pressure setting to the proportional valve 118 included in the wafer lift pin system 100, as described above.

As further shown in FIG. 6, process 600 may include providing a supply of the gas to one or more lift pins to cause the one or more lift pins to raise a semiconductor wafer that is supported on the one or more lift pins, where the proportional valve modulates the supply of the gas to the one or more lift pins such that the gas is supplied to the one or more lift pins approximately at the pressure setting (block 640). For example, the proportional valve 118 may provide a supply of the gas to the one or more lift pins 102a-102c to cause the one or more lift pins to raise the semiconductor wafer 108 that is supported on the one or more lift pins 102a-102c, as described above. In some implementations, the proportional valve 118 modulates the supply of the gas to the one or more lift pins 102a-102c such that the gas is supplied to the one or more lift pins 102a-102c approximately at the pressure setting.

Process 600 may include additional implementations, such as any single implementation or any combination of implementations described below and/or in connection with one or more other processes described elsewhere herein.

In a first implementation, process 600 includes maintaining, by the proportional valve 118, a pressure of the supply of the gas to the one or more lift pins at the pressure setting after the semiconductor wafer has been raised to an extended configuration. In a second implementation, alone or in combination with the first implementation, providing the supply of the gas to the one or more lift pins includes determining (e.g., by the proportional valve 118 and using the pressure sensor 140) a pressure of the supply of the gas to the one or more lift pins, and modulating the supply of the gas to the one or more lift pins such that the pressure of the gas is within a threshold of the pressure setting.

In a third implementation, alone or in combination with one or more of the first and second implementations, determining the pressure of the supply of the gas to the one or more lift pins includes determining the pressure of the supply of the gas to the one or more lift pins based on pressure sensor data generated by the pressure sensor 140 associated with the proportional valve. In a fourth implementation, alone or in combination with one or more of the first through third implementations, process 600 includes determining (e.g., by the controller 136) the pressure setting to achieve a particular rise time for raising the semiconductor wafer.

In a fifth implementation, alone or in combination with one or more of the first through fourth implementations, determining the pressure setting to achieve the particular rise time for raising the semiconductor wafer includes determining (e.g., by the controller 136) the pressure setting to compensate for elastic fatigue of springs included in the one or more lift pins. In a sixth implementation, alone or in combination with one or more of the first through fifth implementations, process 600 includes determining (e.g., by the controller 136) the pressure setting based on data associated with the one or more lift pins indicating historical rise times and associated pressures for the one or more lift pins.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

Figure 7:
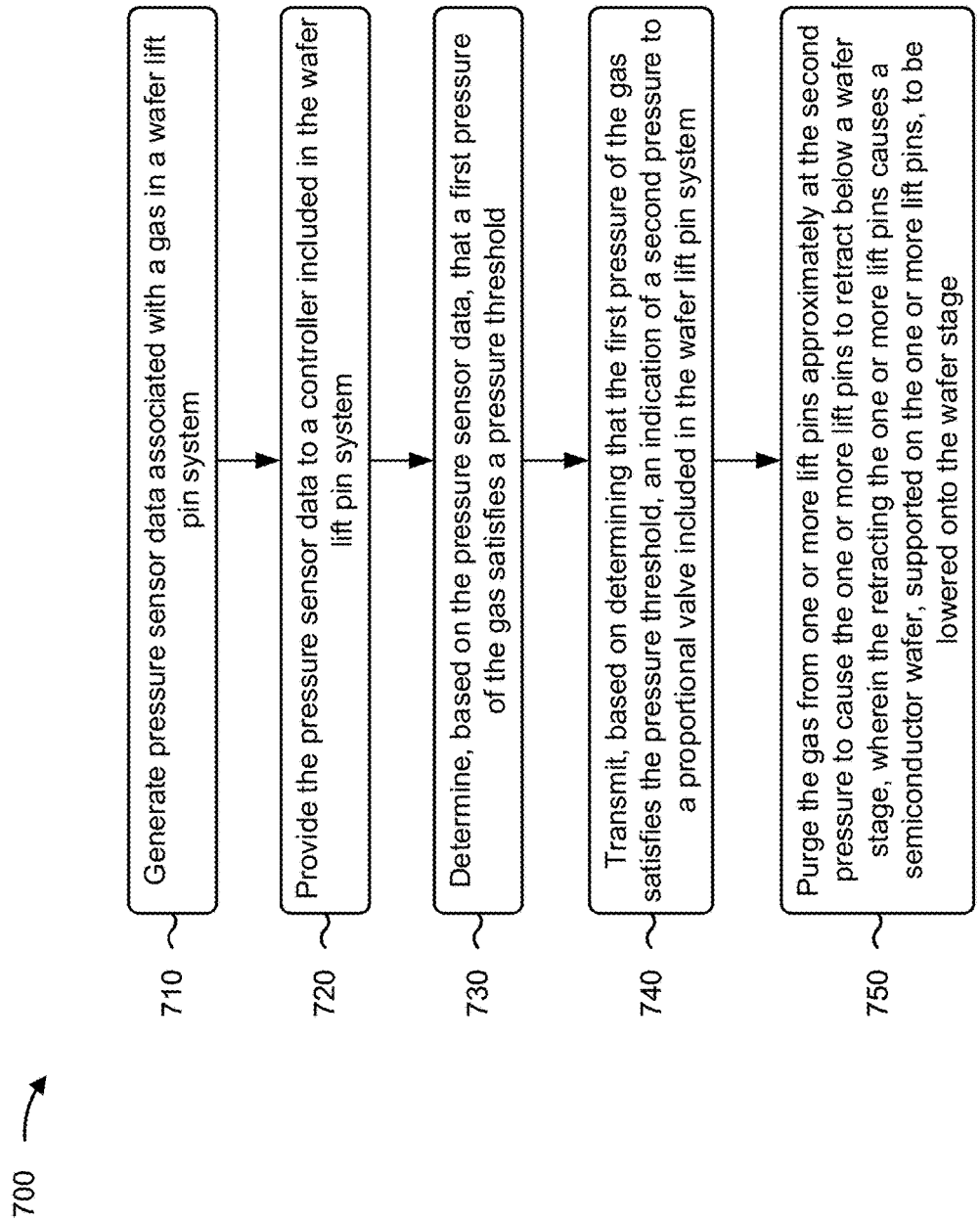

FIG. 7 is a flowchart of an example process 700 associated with operating a wafer lift pin system. In some implementations, one or more process blocks of FIG. 7 may be performed by one or more devices of a wafer lift pin system (e.g., one or more of the one or more lift pins 102a-102c, the manifold 114, the proportional valve 118, the storage tank 120, the check valve 126, the one-way solenoid valve 128, the controller 136, the pressure sensor 138, and/or the pressure sensor 140). Additionally, or alternatively, one or more process blocks of FIG. 7 may be performed by one or more components of device 500, such as processor 520, memory 530, storage component 540, input component 550, output component 560, and/or communication component 570.

As shown in FIG. 7, process 700 may include generating pressure sensor data associated with a gas in a wafer lift pin system (block 710). For example, the pressure sensor 138 may generate pressure sensor data associated with a gas in the wafer lift pin system 100, as described above.

As further shown in FIG. 7, process 700 may include providing the pressure sensor data to a controller included in the wafer lift pin system (block 720). For example, the pressure sensor 138 may provide the pressure sensor data to the controller 136 included in the wafer lift pin system, as described above.

As further shown in FIG. 7, process 700 may include determining, based on the pressure sensor data, that a first pressure of the gas satisfies a pressure threshold (block 730). For example, the controller 136 may determine, based on the pressure sensor data, that a first pressure of the gas satisfies a pressure threshold, as described above.

As further shown in FIG. 7, process 700 may include transmitting, based on determining that the first pressure of the gas satisfies the pressure threshold, an indication of a second pressure to a proportional valve included in the wafer lift pin system (block 740). For example, the controller 136 may transmit, based on determining that the first pressure of the gas satisfies the pressure threshold, an indication of a second pressure to the proportional valve 118 included in the wafer lift pin system 100, as described above.

As further shown in FIG. 7, process 700 may include purging the gas from one or more lift pins approximately at the second pressure to cause the one or more lift pins to retract below a wafer stage, wherein the retracting the one or more lift pins causes a semiconductor wafer, supported on the one or more lift pins, to be lowered onto the wafer stage (block 750). For example, the proportional valve 118 may purge the gas from the one or more lift pins 102a-102c approximately at the second pressure to cause the one or more lift pins to retract below a wafer stage 106, as described above. In some implementations, retracting the one or more lift pins causes the semiconductor wafer 108, supported on the one or more lift pins 102a-102c, to be lowered onto the wafer stage 106.

Process 700 may include additional implementations, such as any single implementation or any combination of implementations described below and/or in connection with one or more other processes described elsewhere herein.

In a first implementation, purging the gas from the one or more lift pins includes dynamically adjusting (e.g., by the proportional valve 118) a rate at which the gas is purged from the one or more lift pins to achieve the second pressure. In a second implementation, alone or in combination with the first implementation, dynamically adjusting the rate at which the gas is purged from the one or more lift pins includes dynamically adjusting (e.g., by the proportional valve 118) the rate at which the gas is purged from the one or more lift pins based on pressure sensor data generated by the pressure sensor 140 associated with the proportional valve 118. In a third implementation, alone or in combination with one or more of the first and second implementations, process 700 includes maintaining (e.g., by the proportional valve 118) a pressure of the gas in the one or more lift pins approximately at a third pressure prior to purging the gas from the one or more lift pins.

In a fourth implementation, alone or in combination with one or more of the first through third implementations, maintaining the pressure of the gas in the one or more lift pins approximately at the third pressure includes providing a supply flow of the gas from the storage tank 120 included in the wafer lift pin system to maintain the pressure of the gas in the one or more lift pins approximately at the third pressure. In a fifth implementation, alone or in combination with one or more of the first through fourth implementations, process 700 includes maintaining (e.g., by the check valve 126 included in the wafer lift pin system) a third pressure of a gas in a storage tank included in the wafer lift pin system prior to purging the gas from the one or more lift pins.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

In this way, the wafer lift pin system is capable of dynamically modulating or adjusting the flow of gas into and out of the lift pins of the wafer lift pin system to achieve and maintain a consistent pressure in the supply lines that supply the gas to the lift pins. This enables the wafer lift pin system to precisely control the speed, acceleration, and deceleration of the lift pins to achieve consistent and repeatable lift pin rise times and fall times. The wafer lift pin system may include a controller and various sensors and valves that are capable of configuring and controlling the gas pressures in the wafer lift pin system based on various factors, such as historic rise times, historic fall times, and/or the condition of the lift pins. In this way, the wafer lift pin system enables smoother and more controlled automatic operation of the lift pins, which reduces and/or minimizes wafer shifting and wafer instability resulting from extension and retraction of the lift pins, which may reduce processing defects and maintain or improve processing yields.

As described in greater detail above, some implementations described herein provide a method. The method includes providing, by a pressure sensor included in a wafer lift pin system, pressure sensor data to a controller included in the wafer lift pin system. The method includes determining, by the controller and based on the pressure sensor data, that a gas is being supplied to the wafer lift pin system. The method includes transmitting, by the controller and based on determining that the gas is being supplied to the wafer lift pin system, an indication of a pressure setting to a proportional valve included in the wafer lift pin system. The method includes providing, by the proportional valve, a supply of the gas to one or more lift pins to cause the one or more lift pins to raise a semiconductor wafer that is supported on the one or more lift pins, where the proportional valve modulates the supply of the gas to the one or more lift pins such that the gas is supplied to the one or more lift pins approximately at the pressure setting.

As described in greater detail above, some implementations described herein provide a wafer lift pin system. The wafer lift pin system includes a pressure sensor configured to generate pressure sensor data associated with a first supply flow of a gas to a storage tank included in the wafer lift pin system. The wafer lift pin system includes the storage tank configured to receive the first supply flow of the gas and to store the gas. The wafer lift pin system includes a proportional valve configured to selectively, provide a second supply flow of the gas in the storage tank to a plurality of lift pins included in the wafer lift pin system, or purge gas from the plurality of lift pins. The wafer lift pin system includes a controller configured, selectively determine: a first pressure at which the proportional valve is to provide the second supply flow of the gas in the storage tank to the plurality of lift pins, or a second pressure at which the proportional valve is to purge the gas from the plurality of lift pins.

As described in greater detail above, some implementations described herein provide a method. The method includes generating, by a pressure sensor included in a wafer lift pin system, pressure sensor data associated with a gas in the wafer lift pin system. The method includes providing, by the pressure sensor, the pressure sensor data to a controller included in the wafer lift pin system. The method includes determining, by the controller and based on the pressure sensor data, that a first pressure of the gas satisfies a pressure threshold. The method includes transmitting, by the controller and based on determining that the first pressure of the gas satisfies the pressure threshold, an indication of a second pressure to a proportional valve included in the wafer lift pin system. The method includes purging, by the proportional valve, the gas from one or more lift pins approximately at the second pressure to cause the one or more lift pins to retract below a wafer stage, where the retracting the one or more lift pins causes a semiconductor wafer, supported on the one or more lift pins, to be lowered onto the wafer stage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing, by a pressure sensor included in a wafer lift pin system, pressure sensor data to a controller included in the wafer lift pin system;
determining, by the controller and based on the pressure sensor data, that a gas is being supplied to the wafer lift pin system;
transmitting, by the controller and based on determining that the gas is being supplied to the wafer lift pin system, an indication of a pressure setting to a proportional valve included in the wafer lift pin system; and
providing, by the proportional valve, a supply of the gas to one or more lift pins to cause the one or more lift pins to raise a semiconductor wafer that is supported on the one or more lift pins,
wherein the proportional valve determines a pressure of the supply of the gas to the one or more lift pins and modulates the supply of the gas to the one or more lift pins such that the pressure of the gas is within a threshold of the pressure setting.

2. The method of claim 1, further comprising:
maintaining, by the proportional valve, the pressure of the supply of the gas to the one or more lift pins at the pressure setting after the semiconductor wafer has been raised to an extended configuration.

3. The method of claim 1, wherein determining the pressure of the supply of the gas to the one or more lift pins comprises:
determining the pressure of the supply of the gas to the one or more lift pins based on pressure sensor data generated by another pressure sensor associated with the proportional valve.

4. The method of claim 1, further comprising:
determining the pressure setting to achieve a particular rise time for raising the semiconductor wafer.

5. The method of claim 4, wherein determining the pressure setting to achieve the particular rise time for raising the semiconductor wafer comprises:
determining the pressure setting to compensate for elastic fatigue of springs included in the one or more lift pins.

6. The method of claim 1, further comprising:
determining the pressure setting based on data associated with the one or more lift pins indicating historical rise times and associated pressures for the one or more lift pins.

7. The method of claim 1, further comprising:
determining the pressure setting based on a condition of the one or more lift pins.

8. A method, comprising:
generating, by a pressure sensor included in a wafer lift pin system, pressure sensor data associated with a gas in the wafer lift pin system;
providing, by the pressure sensor, the pressure sensor data to a controller included in the wafer lift pin system;
determining, by the controller and based on the pressure sensor data, that a first pressure of the gas satisfies a pressure threshold;
transmitting, by the controller and based on determining that the first pressure of the gas satisfies the pressure threshold, an indication of a second pressure to a proportional valve included in the wafer lift pin system; and
purging, by the proportional valve, the gas from one or more lift pins approximately at the second pressure to cause the one or more lift pins to retract below a wafer stage,
wherein purging the gas from the one or more lift pins comprises dynamically adjusting, by the proportional valve, a rate at which the gas is purged from the one or more lift pins to achieve the second pressure, and
wherein the retracting the one or more lift pins causes a semiconductor wafer, supported on the one or more lift pins, to be lowered onto the wafer stage.

9. The method of claim 8, wherein dynamically adjusting the rate at which the gas is purged from the one or more lift pins comprises:
dynamically adjusting the rate at which the gas is purged from the one or more lift pins based on pressure sensor data generated by another pressure sensor associated with the proportional valve.

10. The method of claim 8, further comprising:
maintaining, by the proportional valve, a pressure of the gas in the one or more lift pins approximately at a third pressure prior to purging the gas from the one or more lift pins.

11. The method of claim 10, wherein maintaining the pressure of the gas in the one or more lift pins approximately at the third pressure comprises:
providing a supply flow of the gas from a storage tank included in the wafer lift pin system to maintain the pressure of the gas in the one or more lift pins approximately at the third pressure.

12. The method of claim 8, further comprising:
maintaining, by a check valve included in the wafer lift pin system, a third pressure of a gas in a storage tank included in the wafer lift pin system prior to purging the gas from the one or more lift pins.

13. The method of claim 8, further comprising:
determining, by the controller, the second pressure based on data associated with the one or more lift pins indicating historical fall times for the one or more lift pins.

14. The method of claim 8, further comprising:
determining the second pressure to achieve a particular fall time for lowering the semiconductor wafer.

15. A wafer lift pin system, comprising:
one or more lift pins configured to support a semiconductor wafer;
a pressure sensor configured to generate pressure sensor data and provide the pressure sensor data;
a controller, configured to:
receive the pressure sensor data from the pressure sensor;
determine, based on the pressure sensor data, that a gas is being supplied to the wafer lift pin system; and
transmit, based on determining that the gas is being supplied to the wafer lift pin system, an indication of a pressure setting; and
a proportional valve configured to:
receive the indication of the pressure setting from the controller; and
provide a supply of the gas to the one or more lift pins to cause the one or more lift pins to raise the semiconductor wafer,
wherein the proportional valve determines a pressure of the supply of the gas to the one or more lift pins and modulates the supply of the gas to the one or more lift pins such that the pressure of the gas is within a threshold of the pressure setting.

16. The wafer lift pin system of claim 15, wherein the proportional valve is further configured to:
maintain a pressure of the supply of the gas to the one or more lift pins at the pressure setting after the semiconductor wafer has been raised to an extended configuration.

17. The wafer lift pin system of claim 15, wherein the proportional valve, to determine the pressure of the supply of the gas to the one or more lift pins, is configured to:
determine the pressure of the supply of the gas to the one or more lift pins based on pressure sensor data generated by another pressure sensor associated with the proportional valve.

18. The wafer lift pin system of claim 15, wherein the controller is further configured to:
determine the pressure setting to achieve a particular rise time for raising the semiconductor wafer.

19. The wafer lift pin system of claim 18, wherein the controller, to determine the pressure setting to achieve the particular rise time for raising the semiconductor wafer, is configured to:
determine the pressure setting to compensate for elastic fatigue of springs included in the one or more lift pins.

20. The wafer lift pin system of claim 15, wherein the controller is further configured to:
determine the pressure setting based on data associated with the one or more lift pins indicating historical rise times and associated pressures for the one or more lift pins.

* * * * *